(12) United States Patent
Tseng et al.

(10) Patent No.: US 7,514,961 B2
(45) Date of Patent: Apr. 7, 2009

(54) LOGIC CIRCUITS

(75) Inventors: Ming-Chun Tseng, Tainan (TW); Hong-Ru Guo, Tainan (TW); Chienh-Siang Huang, Sinying (TW)

(73) Assignees: Chi Mei Optoelectronics Corporation, Tainan (TW); Chi Mei EL Corporation, Tainan (TW)

( * ) Notice: Subject to any disclaimer, the term of this patent is extended or adjusted under 35 U.S.C. 154(b) by 0 days.

(21) Appl. No.: 11/675,909

(22) Filed: Feb. 16, 2007

(65) Prior Publication Data

US 2008/0197882 A1 Aug. 21, 2008

(51) Int. Cl.
*H03K 19/0175* (2006.01)

(52) U.S. Cl. ............................. 326/81; 326/83; 326/86

(58) Field of Classification Search ................ 326/83, 326/88, 81
See application file for complete search history.

(56) References Cited

U.S. PATENT DOCUMENTS 5,465,058 A * 11/1995 Krenik et al. ................. 326/83
5,493,235 A    2/1996  Khayat
5,512,844 A * 4/1996  Nakakura et al. ............. 326/81
5,877,635 A * 3/1999  Lin ............................. 326/83
5,933,025 A * 8/1999  Nance et al. .................. 326/81
6,924,669 B2* 8/2005 Itoh et al. ..................... 326/87
7,053,660 B2* 5/2006 Itoh et al. ..................... 326/87

FOREIGN PATENT DOCUMENTS

TW         I220255       8/2004
TW        200428325     12/2004

* cited by examiner

*Primary Examiner*—Vibol Tan
(74) *Attorney, Agent, or Firm*—Fish & Richardson P.C.

(57) ABSTRACT

A logic circuit includes a logic unit, a driving unit, and a voltage level adjuster. The logic unit includes an output node having a logic state, the logic unit being coupled to a first voltage reference. The driving unit includes an input node, the driving unit being coupled to a second voltage reference, the driving unit and the first logic unit being constructed from a single type of transistor. The voltage level adjuster provides a control signal that causes the driving unit to reduce a current flowing through the driving unit when the output node of the first logic unit has a first logic state, and causes the driving unit to drive an output node of the logic circuit to a voltage level substantially equal to that of the second voltage reference when the output node of the first logic unit has a second logic state.

38 Claims, 33 Drawing Sheets

LOGIC CIRCUITS

BACKGROUND

This description relates to logic circuits.

FIG. 1 is a diagram of an example of an inverter 10 that includes a first p-type metal oxide semiconductor transistor (PMOS) 12 and a second PMOS transistor 14 that are connected in series between voltage $V_{DD}$ and ground. An output capacitor 16 is coupled to the first and second transistors 12 and 14. The inverter 10 has an input node IN for receiving an input voltage Vin and an output node OUT for providing an output voltage Vout.

FIG. 2 is a diagram of an equivalent circuit 20 of the inverter 10 when the input voltage Vin is at logic low. The transistors 12 and 14 are represented by operating impedances $R_1$ 22 and $R_2$ 24, respectively. The series-connected impedances $R_1$ and $R_2$ form a voltage divider.

FIG. 3 are graphs of signal waveforms 30 and 32 that represent an input voltage Vin and an output voltage Vout, respectively, of the inverter 10. When the input voltage Vin is at logic low, the output voltage Vout is equal to $V_{DD}*R2/(R1+R2)$. When the input voltage Vin is at logic high, the output voltage Vout is equal to Vth, in which Vth is the threshold voltage of the second transistor 14.

FIG. 4 is a diagram of an example of an inverter 40 that includes a first PMOS transistor 12, a second PMOS transistor 15, an output capacitor 16, a third PMOS transistor 42, and a coupling capacitor 44. The inverter 40 has an input node 46 for receiving an input voltage Vin and an output node 48 for providing an output voltage Vout.

FIG. 5 is a diagram of an equivalent circuit 50 of the inverter 40 when the input voltage Vin is at logic low. In this case, the inverter 40 functions similar to a voltage divider that includes resistors R1 and R2, similar to those shown in FIG. 2. The output voltage Vout is equal to $V_{DD}*R2/(R1+R2)$. The voltage at a first end 52 (see FIG. 4) of the coupling capacitor 44 is equal to $V_{DD}*R2/(R1+R2)$, and the voltage Vx at a second end 54 of the coupling capacitor 44 is equal to Vth.

FIG. 6 is a diagram of an equivalent circuit 60 of the inverter 40 when the input voltage Vin is at logic high. In this case, the first transistor 12 is turned off (hence not shown in the figure), the second transistor 15 remains on, and the voltage at the first end 52 of the coupling capacitor 44 decreases to Vth. Because the voltage difference between the first and second ends 52 and 54 of the coupling capacitor 44 is maintained at $[V_{DD}*R2/(R1+R2)-Vth]$, the voltage Vx at the second end 54 of the coupling capacitor 44 drops to $[Vth-V_{DD}*R2/(R1+R2)]$. The output voltage Vout drops to $V_{SS}$.

FIG. 7 shows graphs of signal waveforms 62, 64, and 66 that represent the input voltage Vin, output voltage Vout, and the voltage Vx, respectively.

Other logic circuits, such as NAND and NOR circuits, can also be constructed using a single type transistor. FIG. 8 is a diagram of an NAND logic circuit 70 constructed using PMOS transistors, including a first PMOS transistor 72, a second PMOS transistor 74, a third PMOS transistor 14, and an output capacitor 16. Input nodes 76 and 78 (which receive input signals Vin1 and Vin2, respectively) are connected to the gates of the transistors 72 and 74, respectively. An output node 80 (having an output signal Vout) is connected to the source of the transistor 74, drain of the transistor 14, and one end of the capacitor 16.

FIG. 9 shows graphs of signal waveforms 82, 84, and 86 of the input voltage Vin1, input voltage Vin2, and the output voltage Vout, respectively, of the NAND logic circuit 70.

SUMMARY

In one aspect, in general, an apparatus includes a logic circuit includes a logic unit, a driving unit, and a voltage level adjuster. The logic unit includes an output node having a logic state, the logic unit being coupled to a first voltage reference. The driving unit includes an input node, the driving unit being coupled to a second voltage reference, the driving unit and the first logic unit being constructed from a single type of transistor. The voltage level adjuster provides, to the input node of the driving unit, a control signal that has a first voltage level that causes the driving unit to reduce a current flowing through the driving unit when the output node of the first logic unit has a first logic state, and has a second voltage level that causes the driving unit to drive an output node of the logic circuit to a voltage level substantially equal to that of the second voltage reference when the output node of the first logic unit has a second logic state.

Implementations of the apparatus may include one or more of the following features. The logic circuit is configured such that the output node of the logic circuit has a voltage level substantially equal to that of the first voltage reference when the output node of the first logic unit has the first logic state. The driving unit includes a transistor that has a gate, a drain, and a source. The gate is coupled to the input node of the driving unit, the drain is coupled to the output node of the driving unit, and the source is coupled to the second voltage reference. The output node of the first logic unit is coupled to the output node of the driving unit. The apparatus includes a second logic unit configured to perform a same logic function as the first logic unit. In some examples, the second logic unit has an output node that is coupled to an input node of the voltage level adjuster. The apparatus includes a third logic unit configured to perform a same logic function as the first logic unit, the third logic unit having an output node that is coupled to the input node of the driving unit. In some examples, the second logic unit has an output node that is coupled to the input node of the driving unit. The output node of the first logic unit is coupled to an input node of the voltage level adjuster.

The apparatus includes a first buffer, which includes an input node and an output node. The input and output nodes of the first buffer has a same logic state, the input node of the first buffer being coupled to the output node of the first logic unit, and the output node of the first buffer being coupled to the output node of the driving unit. The apparatus includes a second buffer that has an input node and an output node, the input and output nodes of the second buffer having a same logic state, the input node of the second buffer being coupled to the output node of the first logic unit. In some examples, the output node of the second buffer is coupled to the input node of the driving unit. In some examples, the output node of the second buffer is coupled to an input node of the voltage level adjuster. The first buffer includes a second logic unit configured to perform a same logic function as the first logic unit. In some examples, the second logic unit has an output node that is coupled to the input node of the driving unit.

The second voltage reference has a voltage level lower than that of the first voltage reference, and the voltage level adjuster is configured to set the control signal to a voltage level lower than that of the second voltage reference when the output node of the first logic unit has the second logic state. In some examples, the first logic unit and the driving unit include PMOS transistors. The second voltage reference has a level higher than that of the first voltage reference, and the voltage level adjuster is configured to set the control signal to a voltage level higher than that of the second voltage reference when the output signal of the first logic unit has the second logic state. In some examples, the first logic unit and the driving unit include NMOS transistors. The first voltage reference has a voltage level higher than that of the second voltage reference, the first logic state includes a logic high state, and the second logic state includes a logic low state. In some examples, the first logic unit is configured to perform a logic function includes at least one of AND, NAND, OR, NOR, XOR, and NOT. In some examples, the first logic unit includes at least one input node to receive at least one input signal, and is configured to perform a function equivalent to at least one of a counter, a shift register, and a programmable pulse width signal generator. The voltage level adjuster includes a coupling capacitor that maintains a voltage across the coupling capacitor when the output node of the first logic unit switches from the first logic state to the second logic state. The voltage level adjuster is configured to set the control signal to a voltage level that turns off the driving unit when the output node of the first logic unit is at the first logic state. The apparatus includes a power supply for providing the first voltage reference and the second voltage reference.

In another aspect, in general, a display includes pixel circuits fabricated on a substrate and including transistors of a single type. The display includes a logic circuit fabricated on the substrate and having transistors of the single type. The logic circuit is coupled to a first voltage reference $V_{DD}$ and a second voltage reference $V_{SS}$, and is configured such that an output node has a voltage level substantially equal to that of $V_{DD}$ when the output node is at a first logic state, and the output node has a voltage level substantially equal to that of $V_{SS}$ when the output node is at a second logic state.

Implementations of the display may include one or more of the following features. The logic circuit includes a programmable pulse width signal generator. The logic circuit includes a transistor for driving the output node to a voltage level substantially equal to $V_{DD}$ or $V_{SS}$ when the output node is at the second logic state, the transistor being turned off when the output node is at the first logic state.

In another aspect, in general, a full swing logic circuit includes a driving unit and a logic unit. The driving unit includes an input node, the driving unit being coupled to a first voltage reference. The logic unit includes an output node having a logic state, the logic unit being coupled to a second voltage reference, the logic unit driving the output node to a voltage level substantially equal to that of the first voltage reference when the output node is at a first logic state. The logic unit provides to the driving unit a control signal that has a first voltage level that causes the driving unit to reduce a current flowing through the driving unit when the output node of the first logic unit has the first logic state, and has a second voltage level that causes the driving unit to drive the output node of the logic unit to a voltage level substantially equal to that of the second voltage reference when the output node of the first logic unit has a second logic state. The driving unit and the first logic unit are constructed from a single type of transistor.

In another aspect, in general, a full swing logic circuit includes a logic unit that has a first PMOS transistor and an output node, the logic unit being coupled to a high voltage reference $V_{DD}$. The full swing logic circuit includes a second PMOS transistor that has a gate, a source, and a drain, the drain being coupled to the output node of the logic unit, the source being coupled to a low voltage reference $V_{SS}$. The full swing logic circuit includes a voltage level adjuster coupled to the gate of the second PMOS transistor, the voltage level adjuster being configured to generate a high or low level gate signal when the output node of the logic unit has a high or low level, respectively, the low level gate signal having a voltage level lower than that of $V_{SS}$.

In another aspect, in general, a full swing logic circuit includes a logic unit that has a first NMOS transistor and an output node, the logic unit being coupled to a low voltage reference $V_{SS}$. The full swing logic circuit includes a second NMOS transistor that has a gate, a source, and a drain, the source being coupled to the output node of the logic unit, the drain being coupled to a high voltage reference $V_{DD}$. The full swing logic circuit includes a voltage level adjuster coupled to the gate of the second NMOS transistor, the voltage level adjuster being configured to generate a high or low level gate signal when the output node of the logic unit has a high or low level, respectively, the high level gate signal having a voltage level higher than that of $V_{DD}$.

In another aspect, in general, a method includes switching an output node to a first logic state, driving the output node to a first voltage level substantially equal to that of a first voltage reference, and turning off a driving unit. The method includes switching the output node to a second logic state, driving the output node to a second voltage level substantially equal to that of a second voltage reference by using the driving unit, and controlling the driving unit using a control signal having a voltage level outside of a range between the first voltage reference and the second voltage reference.

Implementations of the method may include one or more of the following features. In some examples, the driving unit includes a PMOS transistor, and controlling the driving unit includes using a control signal having a voltage level lower than that of the second voltage reference when the output node is switched to the second logic state. In some examples, the driving unit includes an NMOS transistor, and controlling the driving unit includes using a control signal having a voltage level higher than that of the second voltage reference when the output node is switched to the second logic state. Determining the logic state includes using a logic circuit to determine the logic state, the logic circuit and the driving unit being constructed using a single type of transistor.

In another aspect, in general, a method includes generating a logic signal to drive a module of a display, in which generating the logic signal includes determining a logic state of an output node using a logic circuit, and driving the output node to a voltage level substantially equal to that of a first voltage reference and turning off a driving unit when the output node is at a first logic state. The method includes driving the output node to a voltage level substantially equal to that of a second voltage reference by using the driving unit, and controlling the driving unit using a control signal having a voltage level outside of a range between the first voltage reference and the second voltage reference.

Implementations of the method may include one or more of the following features. The logic circuit, the driving unit, and pixel circuits of the display include a single type of transistors.

Advantages of the apparatuses and methods can include one or more of the following. By using a logic circuit that can generate output signals with full rail-to-rail voltage swings, the logic circuit can be powered by power supply voltages that are equal to the voltages required to drive subsequent circuits.

DETAILED DESCRIPTION

A flat panel display can have an array of pixel circuits fabricated on a substrate for showing images. The pixel circuits can include active components, such as thin film transistors. In some examples, logic circuits (e.g., a pulse width modulation signal generator) can also be fabricated on the same substrate using the same type (p-type or n-type MOS transistor) of transistor as the pixel circuits. This description provides examples of ways to construct logic circuits using a single type of transistors (either p-type transistors or n-type transistors, but not both) that can have output voltages close to the upper and lower voltage railings.

Figure 1:
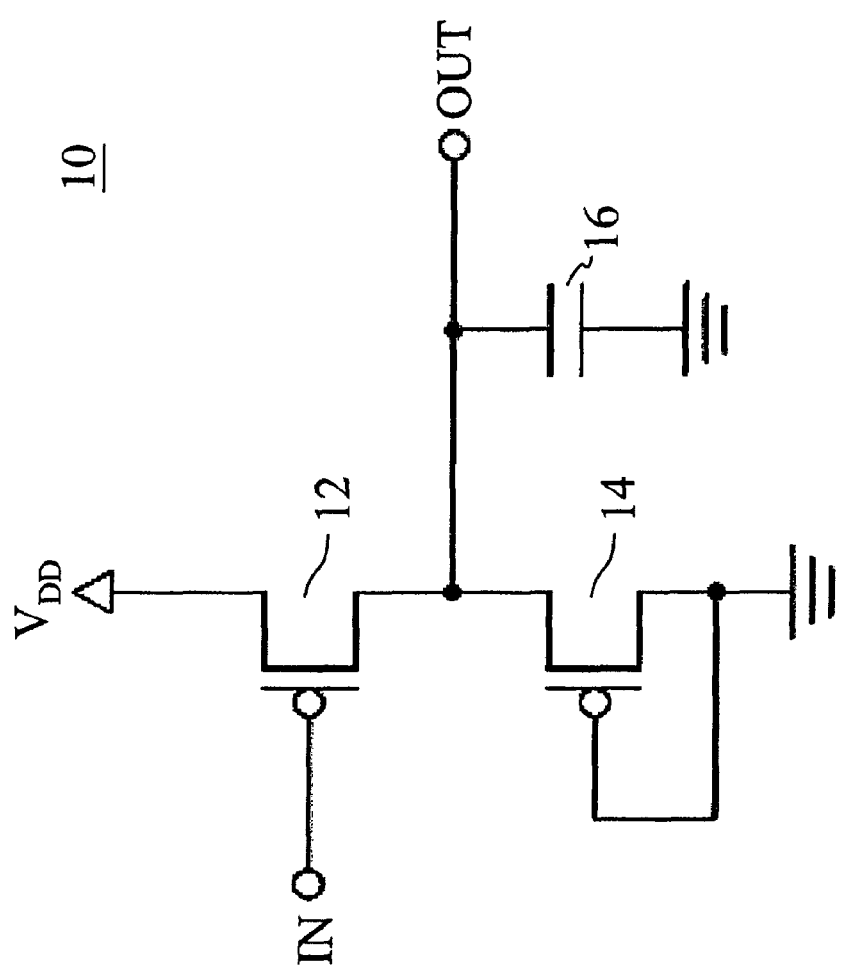
FIG. 1 is a diagram of an inverter.
Figure 2:
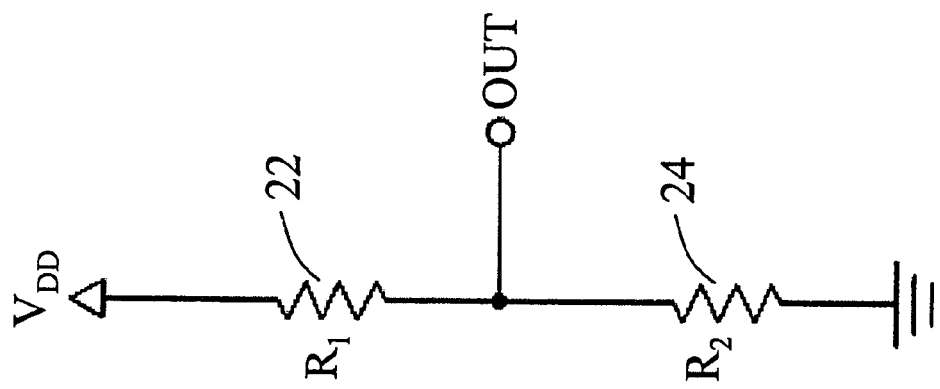
FIG. 2 is a diagram of an equivalent circuit.
Figure 3:
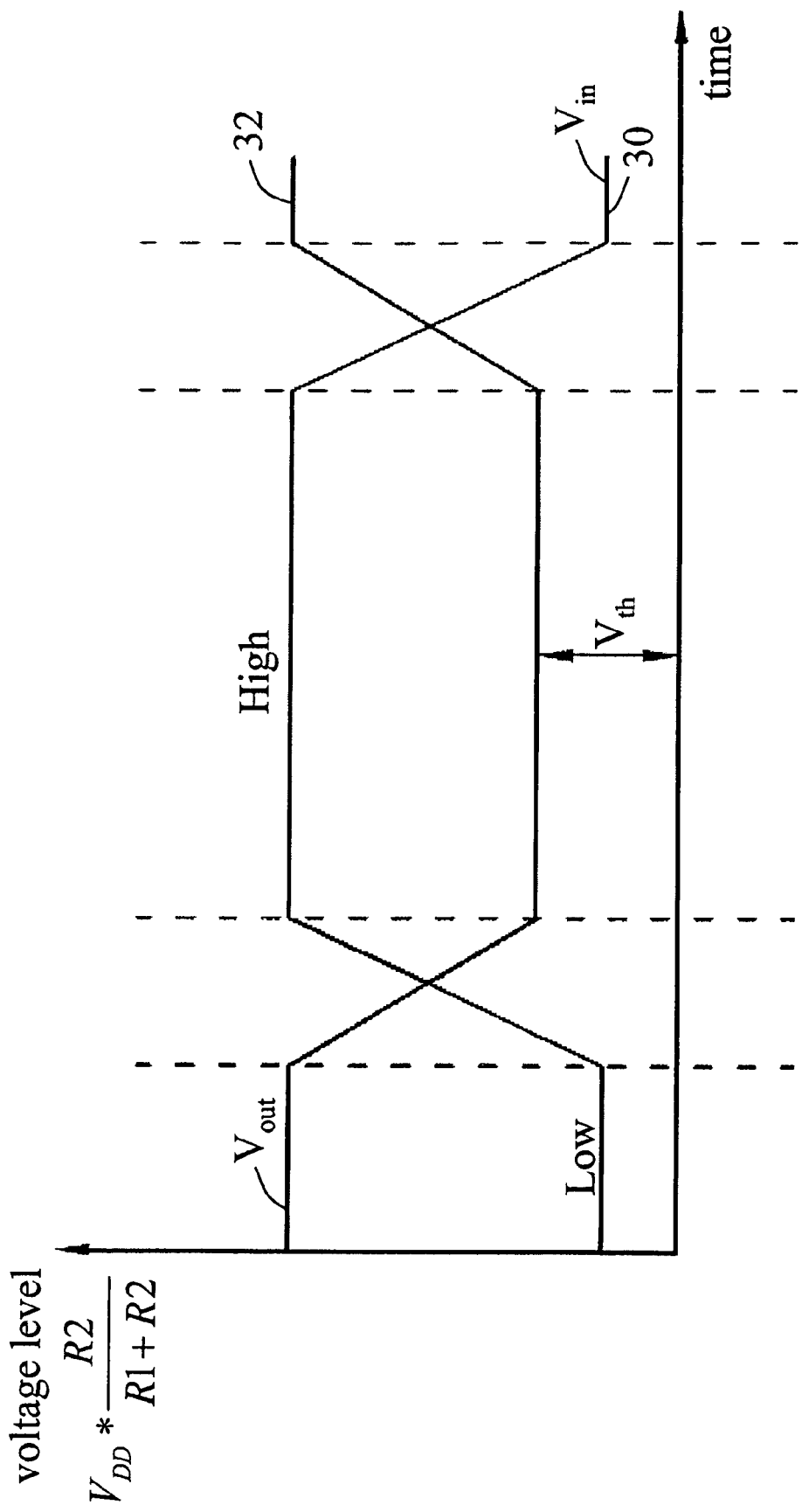
FIG. 3 are graphs of signal waveforms.
Figure 4:
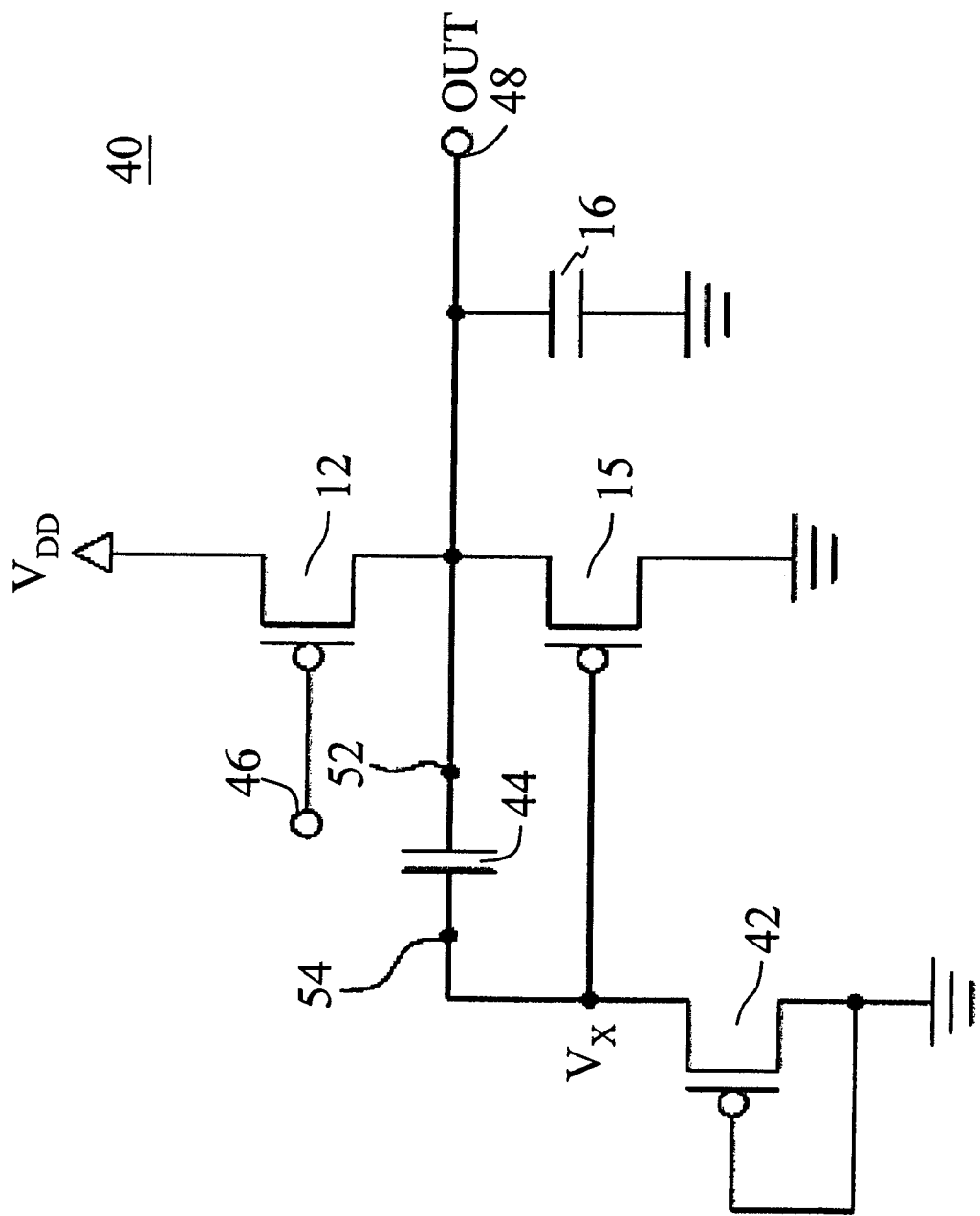
FIG. 4 is a diagram of an inverter.
Figure 5:
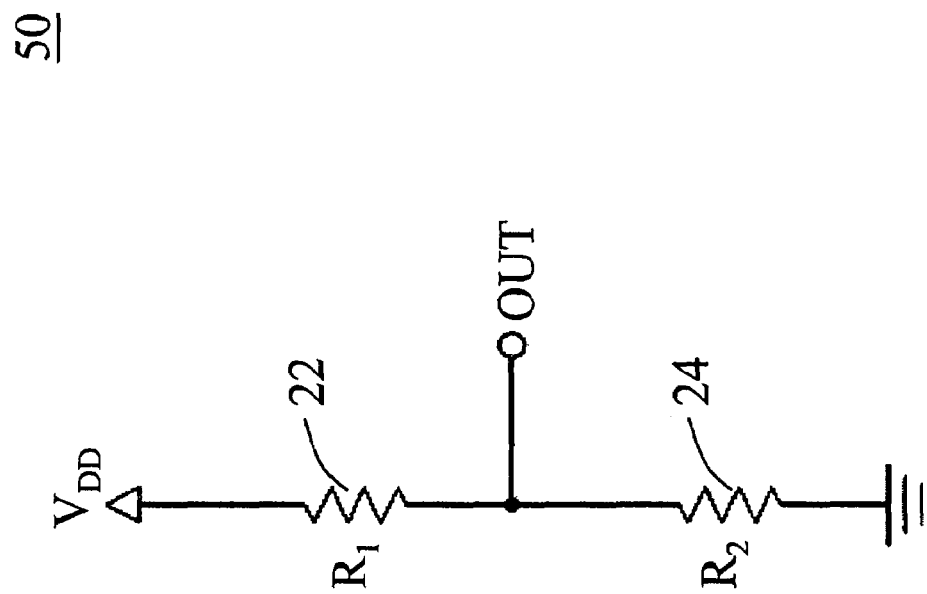
FIGS. 5 and 6 are diagrams of equivalent circuits.
Figure 6:
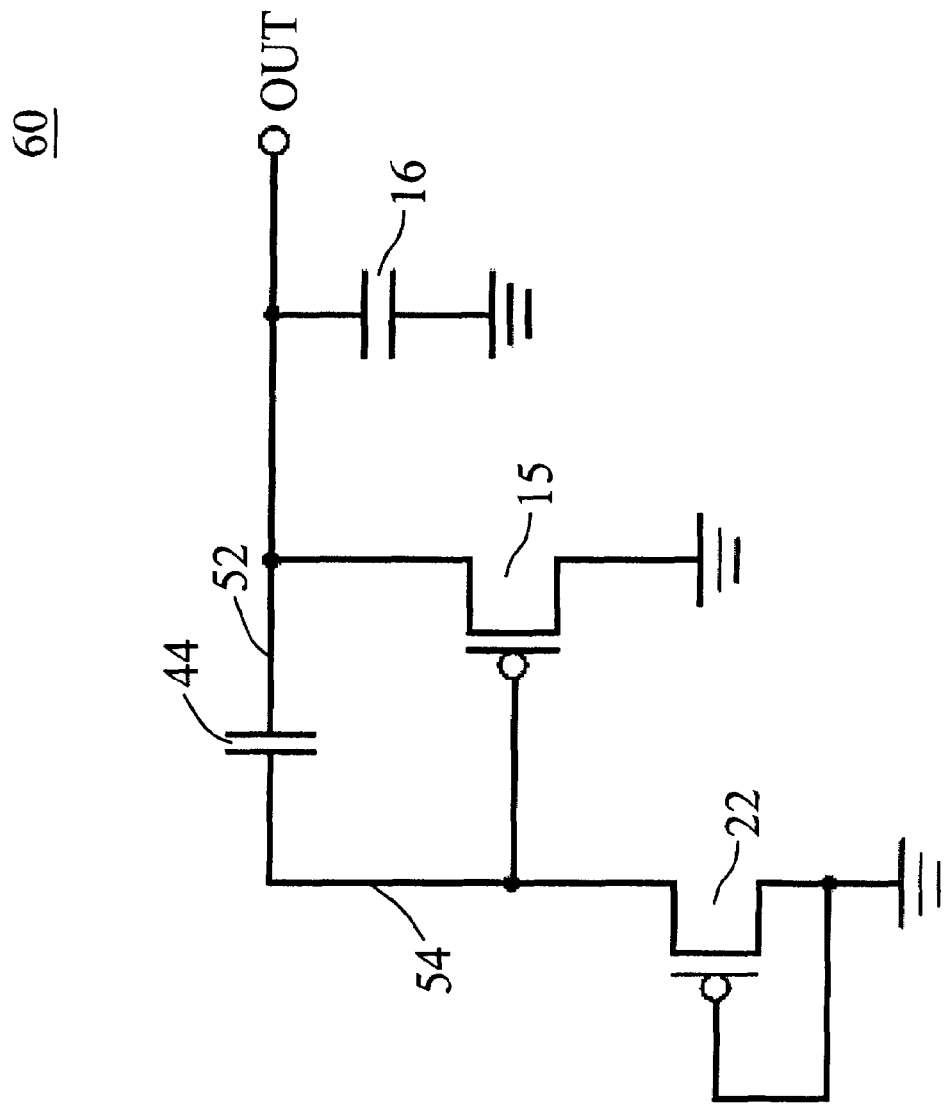
Figure 7:
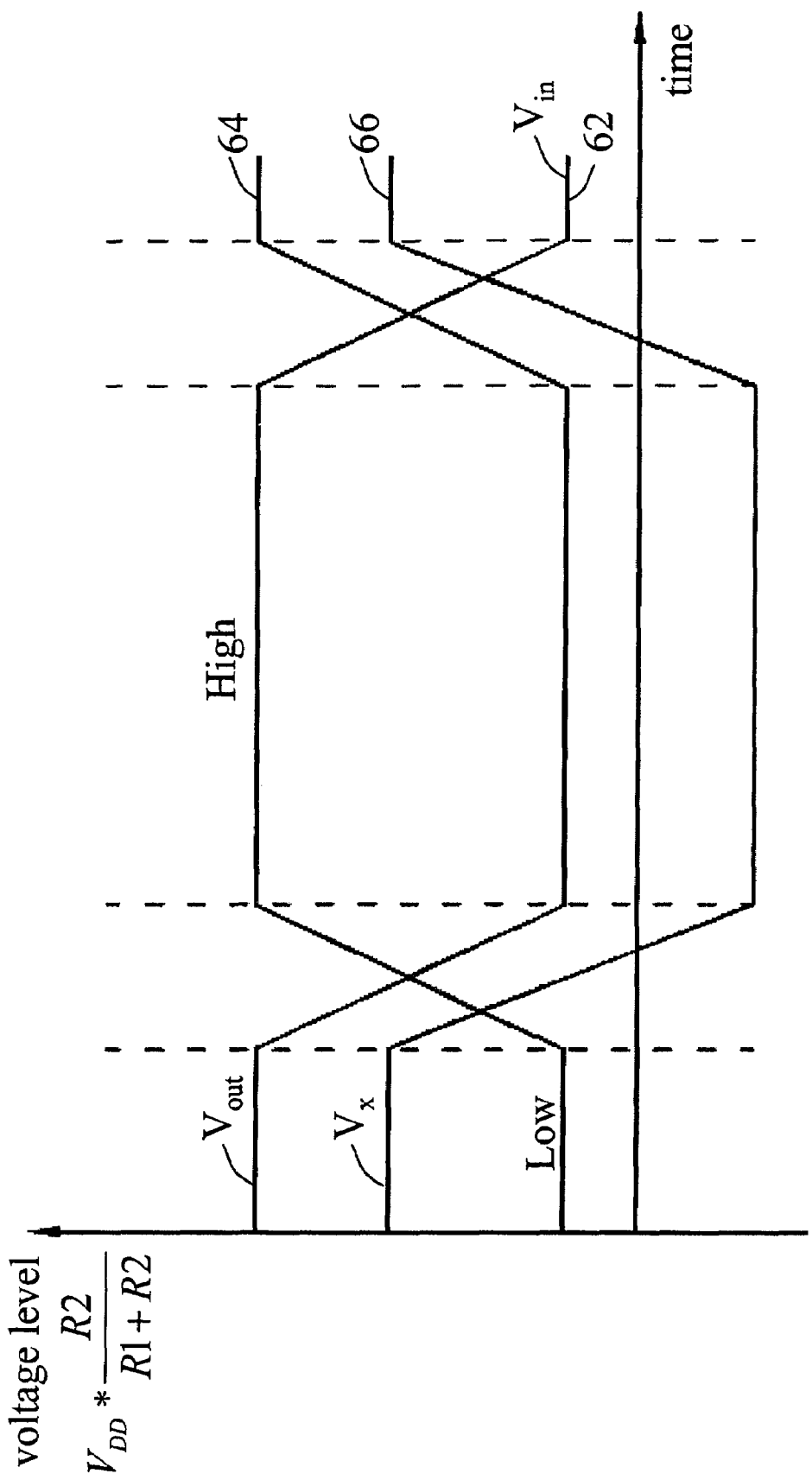
FIG. 7 shows graphs of signal waveforms.
Figure 8:
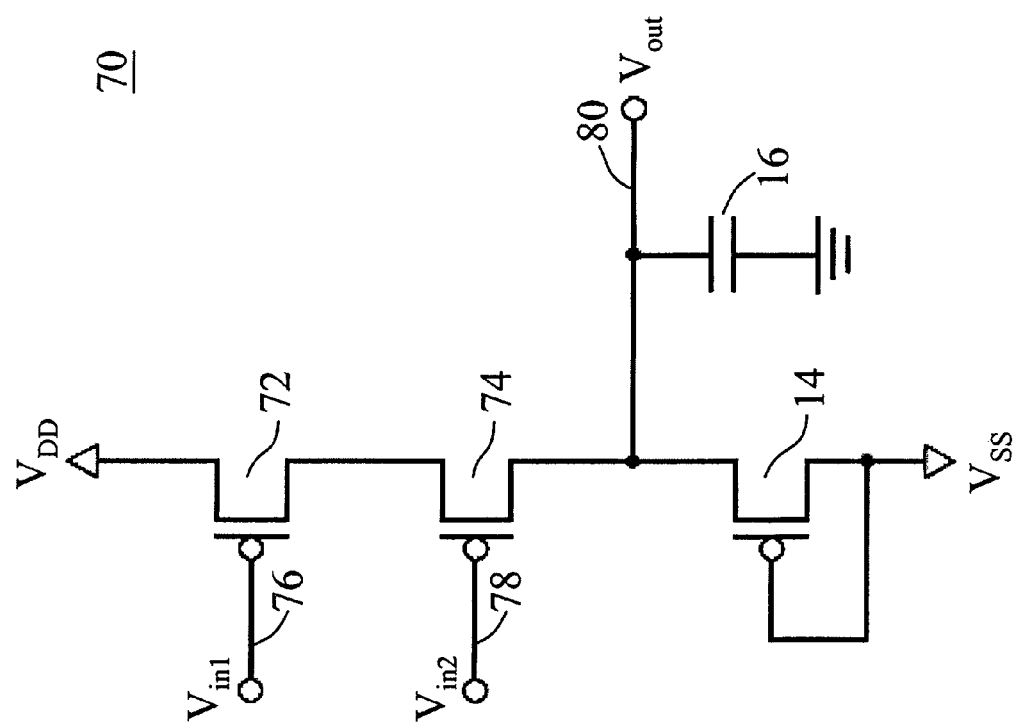
FIG. 8 is a diagram of an NAND logic circuit.
Figure 9:
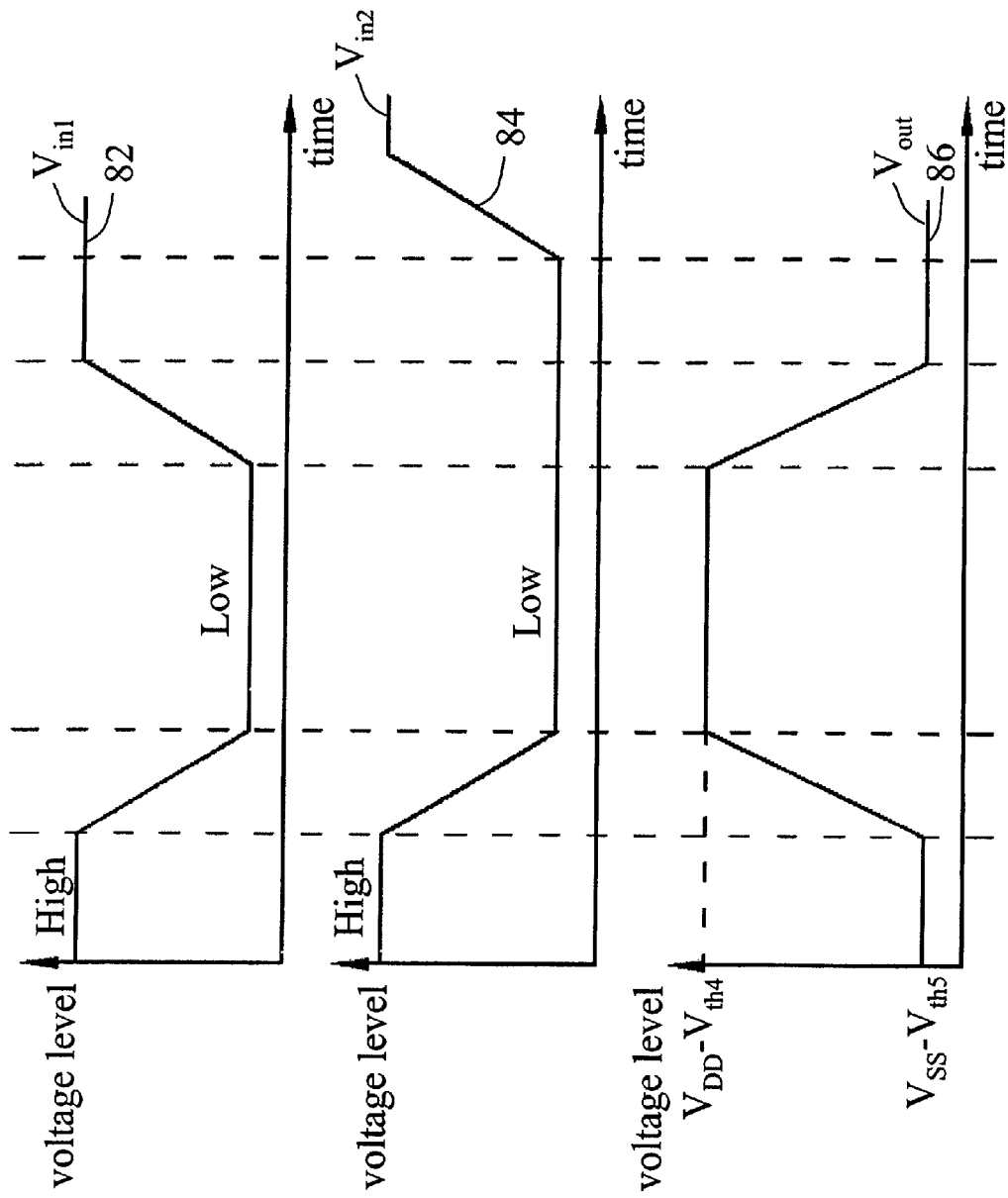
FIG. 9 are graphs of signal waveforms of the NAND logic circuit.
Figure 10A:
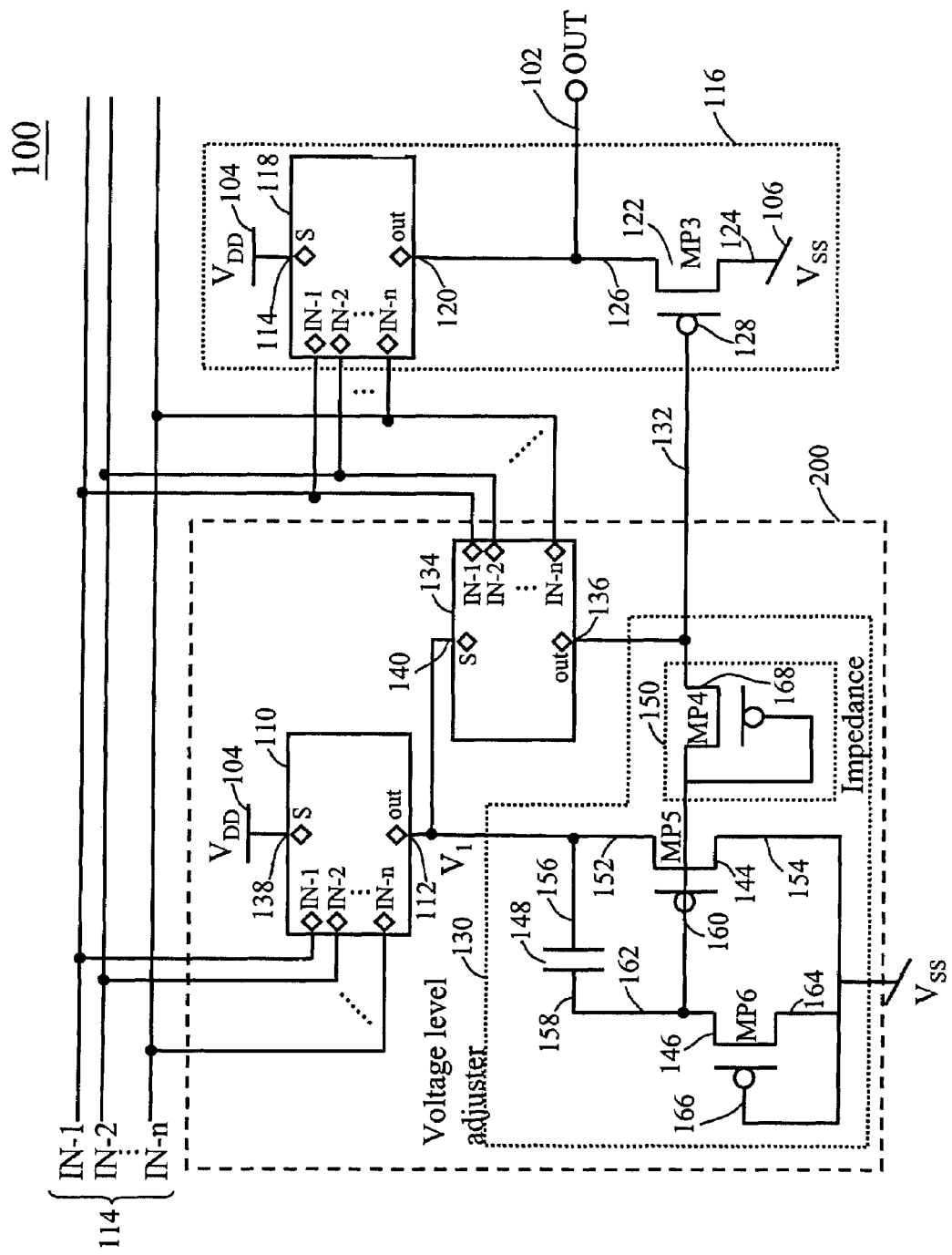
FIGS. 10A and 10B are diagrams of full swing logic circuits.
Figure 10B:
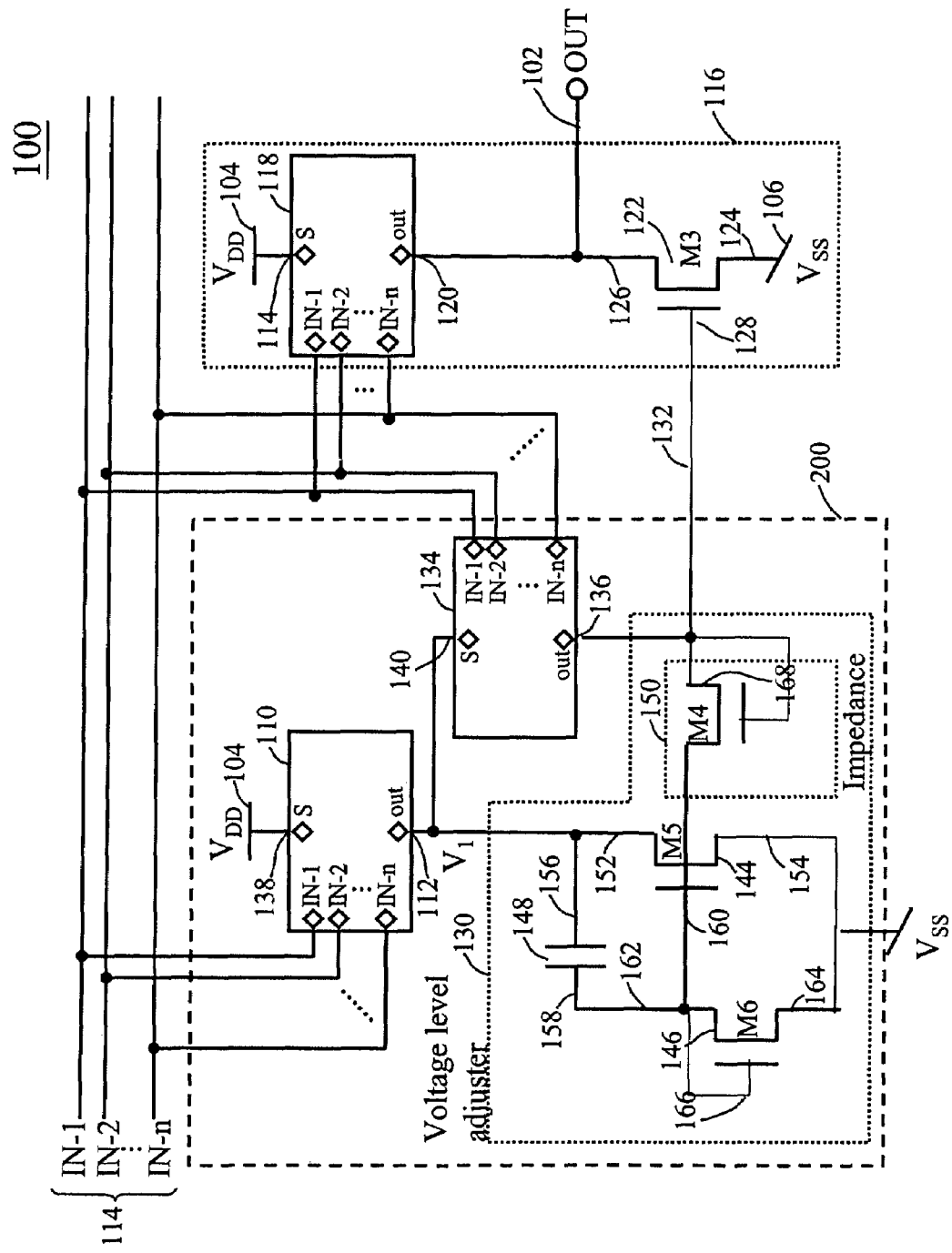

FIG. 10 is diagram of an example of a full swing logic circuit 100 that is constructed from PMOS transistors and can generate a full swing output signal on an output node 102. The circuit 100 receives electric power from a high voltage reference $V_{DD}$ (104) and a low voltage reference $V_{SS}$ (106) that have voltage levels $V_{DD}$ and $V_{SS}$, respectively. The circuit 100 includes a full swing output buffer 116 that drives the output signal to be as high as $V_{DD}$ or as low as $V_{SS}$. The logic circuit 100 can be fabricated on a substrate of flat panel display using transistors of the same type as the transistors of the pixel circuits of the display (see FIG. 24).

The full swing logic circuit 100 includes a first logic unit 110 that determines a logic state of an output node 112 based on one or more input signals received from one or more input signal lines 114. The first logic unit 110 has an input reference voltage node 138 that is coupled to the high voltage reference $V_{DD}$. The first logic unit 110 can be, e.g., a logic gate such as an AND, NAND, OR, NOR, XOR, or NOT gate, or a logic circuit such as a counter, shift register, or programmable pulse-width-modulated signal generator.

The output buffer 116 drives the output node 102 according to the logic function of the first logic unit 110. In some examples, the output buffer 116 includes a second logic unit 118 and a driving unit, such as a transistor MP3 (122). The second logic unit 118 receives input signals from input signal lines 114, performs the same logic function as the first logic unit 110, and has an output node that is coupled to the output node 102. When the output node 112 of the first logic unit 110 is at a logic high or low state, the output node 120 of the second logic unit 118 is also at a logic high or low state, respectively. The transistor MP3 (122) has a source 124 that is connected to the low voltage reference 106, and a drain 126 that is connected to the output node 102.

The output buffer 116 is configured such that, when the output node 102 has a logic high state, the logic unit 118 pulls the output node 102 to a voltage level substantially equal to $V_{DD}$. The difference between the voltage level of the output node 102 and $V_{DD}$ is less than, e.g., the threshold voltage of the transistors in the output buffer 116, or one-half the threshold voltage of the transistors in the output buffer 116. When the output node 102 has a logic low state, the transistor MP3 (122) pulls the output node 102 to a voltage level substantially equal to $V_{SS}$. The difference between the voltage level of the output node 102 and $V_{SS}$ is less than, e.g., the threshold voltage of the transistor MP3 (122), or one-half the threshold voltage of the transistor MP3 (122).

When the first and second logic units 110, 118 determine that the output nodes 112, 120 have logic high states, the first and second logic units 110, 118 pull the output nodes 112, 120 to a voltage level substantially equal to $V_{DD}$. The transistor 112 is turned off when the output node 102 has a logic high state. When the first and second logic units 110, 118 determine that the output nodes 112, 120 have logic low states, the transistor MP3 (122) functions as a driver that pulls the output node 102 to a voltage level substantially equal to $V_{SS}$. To enable the transistor MP3 (122) to pull the output node 102 to $V_{SS}$, the voltage at a gate 128 of the transistor MP3 (122) is pulled lower than $V_{SS}$–Vth, in which Vth is the threshold voltage of the transistor MP3 (122).

The output node 112 of the first logic unit 110 is connected to a voltage level adjuster 130 that outputs a control signal on a signal line 132 connected to the gate 128 of the transistor MP3 (122). The control signal has a voltage level that is lower than that of the output node 112 of the first logic unit 112. For example, if the output node 112 is at logic low state and has a voltage level equal to about $V_{SS}$, the output voltage of the voltage level adjuster 130 has a level lower than $V_{SS}$–Vth3, in which Vth3 is the threshold voltage of the transistor MP3 (122).

The voltage level adjuster 130 includes a transistor MP5 (144), a transistor MP6 (146), a capacitor 148, and an impedance element 150. The transistor MP5 has a drain 152 connected to the output node 112 of the first logic unit 110, and a source 154 that is connected to the low voltage reference $V_{SS}$. The capacitor 148 has a first node 156 and a second node 158 that are connected to the drain 152 and a gate 160, respectively, of the transistor MP5 (144). The transistor MP6 (146) has a drain 162 that is connected to the second node 158 of the capacitor 148, and a source 164 and a gate 166 that are connected to the low voltage reference $V_{SS}$. The impedance element 150 can be, e.g., a gate-source connected transistor MP4 (168).

When the output node 112 of the first logic unit 110 has a logic high state, the output node 112 has a voltage level $V1=V_{SS}+(V_{DD}-V_{SS})*R2/(R1+R2)$, in which R1 and R2 are the operating impedances of the first logic unit 110 and the transistor MP5 (144), respectively. At this time, the transistors MP5 and MP6 are turned on. The drain 162 of the transistor MP6 has a voltage level equal to about $V_{SS}+Vth6$, in which Vth6 is the threshold voltage of the transistor MP6. The voltage across the capacitor 148 is $V1-Vth6-V_{SS}=(V_{DD}-V_{SS})*R2/(R1+R2)-Vth6$.

When the output node 112 has a logic low state, the first logic unit 110 stops driving the output node 112, and the transistor MP5 (144) pulls low the voltage at the drain 152 to substantially equal to $V_{SS}$. The gate 160 of the transistor MP5 (144) is connected to the drain 152 through the capacitor 148. Because the voltage difference between the two nodes 156 and 158 are held constant by the capacitor 148, the voltage at the gate 160 drops as the voltage at the drain 152 drops. When the drain 152 of MP5 (144) drops to about $V_{SS}$, the gate 160 of the transistor MP5 (144) drops to about $2 V_{SS}-V1+Vth6=V_{SS}+Vth6-(V_{DD}-V_{SS})*R2/(R1+R2)$.

The gate 160 of the transistor MP5 (144) is connected to the gate 128 of the transistor MP3 (122) through the transistor MP4 (168) (which functions as a resistor). As the voltage at the gate 160 drops to about $V_{SS}+Vth6-(V_{DD}-V_{SS})*R2/(R1+R2)$, the voltage at the gate 128 of the transistor MP3 (122) also drops to about $VSS+Vth6-(V_{DD}-V_{SS})*R2/(R1+R2)$, which is lower than $V_{SS}-Vth3$. This assumes that $(V_{DD}-V_{SS})*R2/(R1+R2)$ is greater than $Vth3+Vth6$, which is generally true. Because the transistor MP3 (122) has a gate voltage lower than $V_{SS}-Vth3$, the transistor MP3 (122) is able to pull the drain 126 and the output node 102 to a voltage equal to about VSS.

A third logic unit 134 is provided to pull the gate 128 of the transistor MP3 (122) to a high level when the output nodes 112, 120 have a logic high state. The third logic unit 134 receives input signals from input signal lines 114, performs the same logic function as the first logic unit 110, and has an output node 136 that is coupled to the gate 128 of the transistor MP3 (122) through the signal line 132. When the output node 112 has a logic high state, the output node 136 also has a logic high state. The third logic unit 134 pulls the gate 128 of the transistor MP3 (122) high, causing the transistor MP3 to be turned off. This reduces power consumption when the output node 102 has a logic high state.

The first, second, and third logic units 110, 118, and 134 are configured such that when the output node 102 has a logic low state, current does not flow through the first, second, and third logic units 110, 118, and 134, reducing power consumption when the output node 102 has a logic low state.

The full swing logic circuit 100 can also be viewed as an output buffer 116 that drives an output node 102, in which the output buffer 116 receives a control signal from a controller 200. The output buffer 116 includes a logic unit 118 and a driver, such as a transistor 122. The controller 200 has a logic unit 110, in which the logic units 110 and 118 receive the same input signals and perform the same logic function. When the output node 102 has a logic high state, the logic unit 118 pulls the output node 102 to a level substantially equal to $V_{DD}$. At the same time, the controller 200 generates a control signal that causes the transistor 122 to be turned off. When the output node 102 has a logic low state, the logic unit 118 is turned off, and the controller 200 generates a control signal that enables the transistor 122 to pull the output node 102 to a level substantially equal to $V_{SS}$.

The voltage references $V_{DD}$ and $V_{SS}$ can be provided by a power supply. In some examples, the voltage reference $V_{SS}$ is at ground voltage.

The following are examples in which the logic units 110, 130, and 132 perform logic functions such as NOT, NOR, and NAND.

Figure 11A:
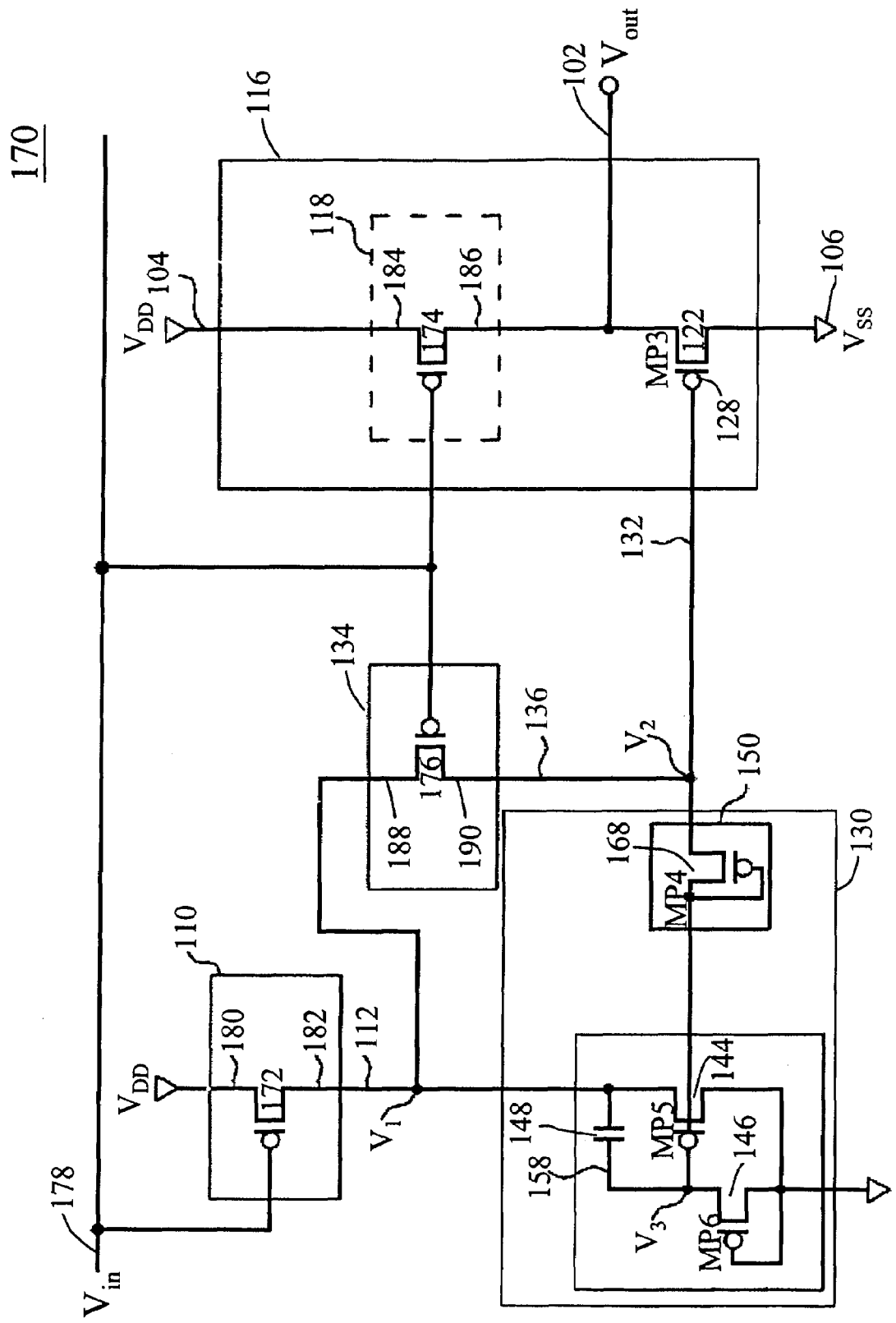
FIGS. 11A and 11B are diagrams of full swing inverters.
Figure 11B:
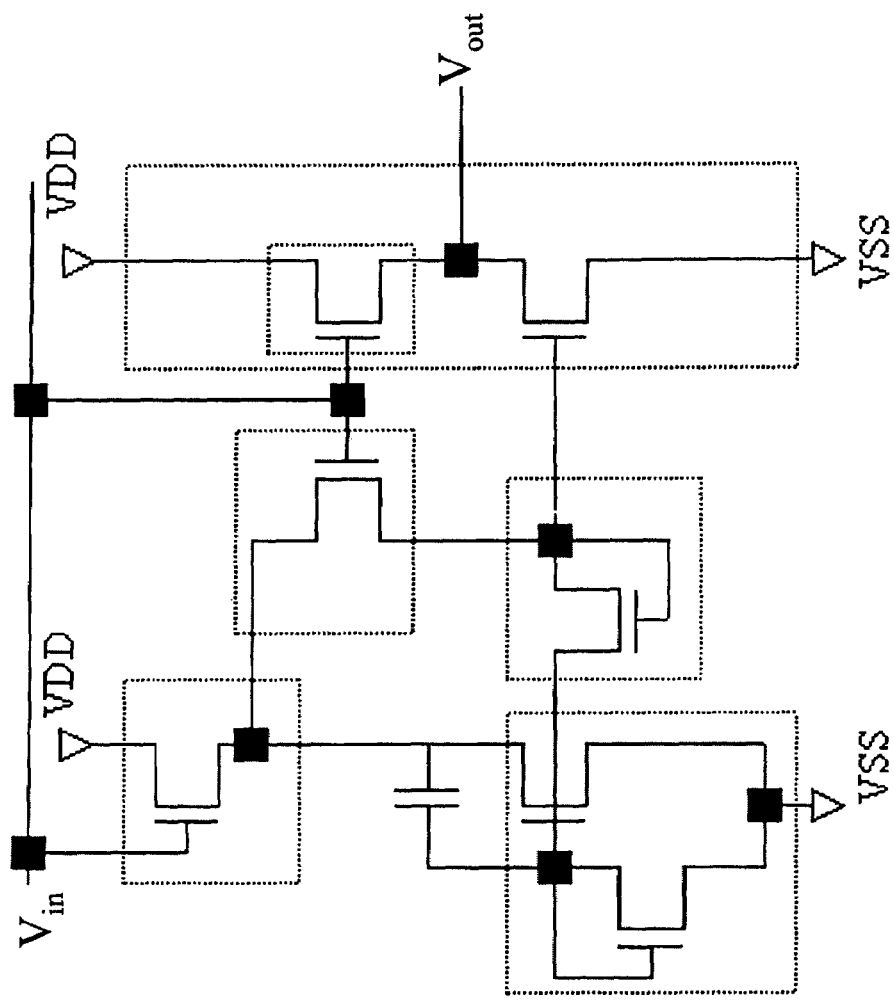

FIG. 11 is a diagram of an example of a full swing inverter 170 that is constructed from PMOS transistors. The full swing inverter 170 can be derived from the circuit 100, in which each of the logic units 110, 118, and 134 includes a PMOS transistor 172, 174, and 176, respectively, that inverts an input signal to generate an output signal. Each of the transistors 172, 174, and 176 has a gate that receives an input signal Vin from an input node 178. The transistor 172 has a drain 180 and a source 182 that are coupled to the input reference voltage node 138 and the output node 112, respectively, of the first logic unit 110. The transistor 174 has a drain 184 and a source 186 that are coupled to the input reference voltage node 114 and the output node 120, respectively, of the second logic unit 118. The transistor 176 has a drain 188 and a source 190 that are coupled to the input reference voltage node 140 and the output node 136, respectively, of the third logic unit 110.

Figure 12:
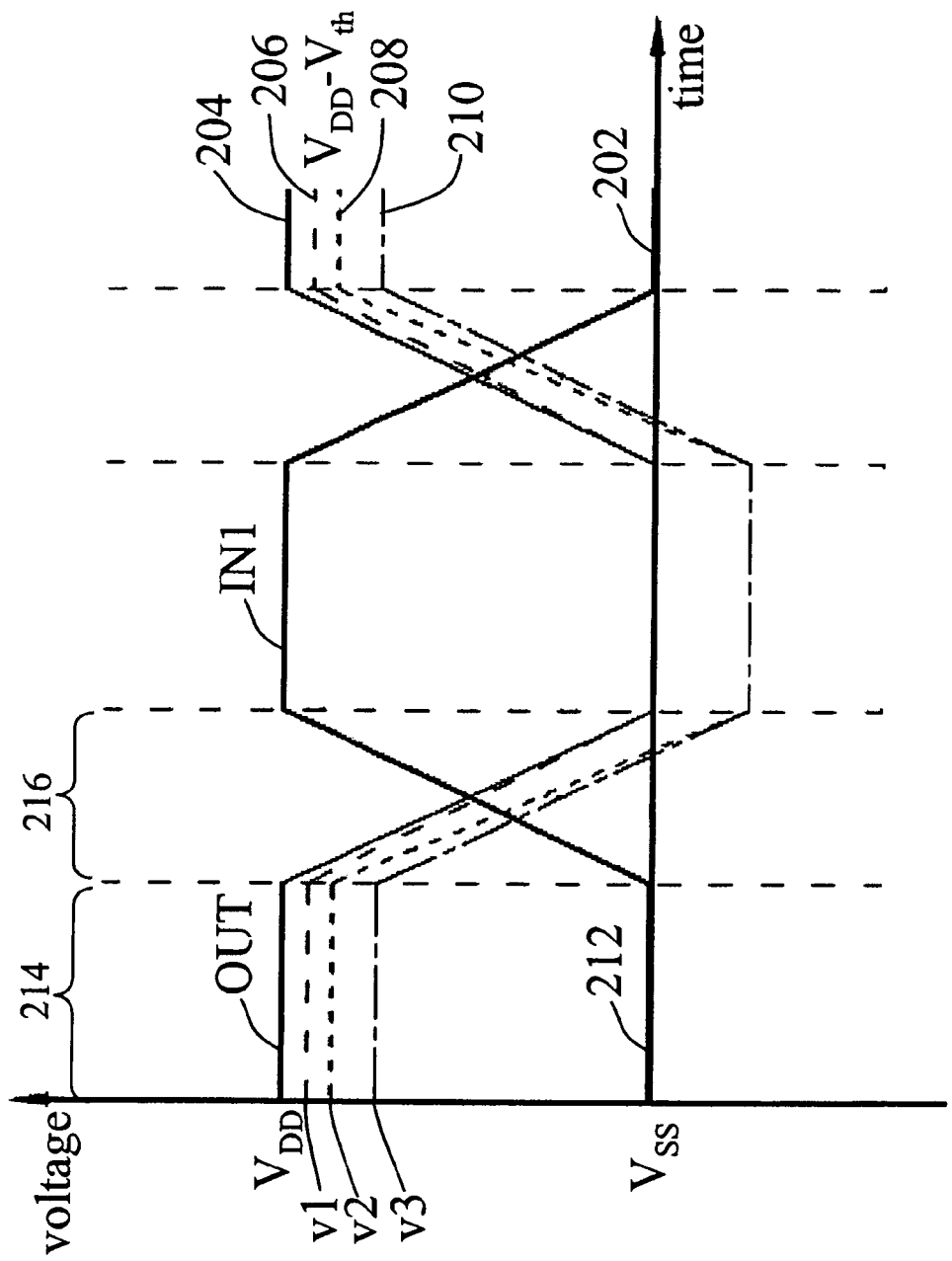
FIG. 12 shows graphs of signal waveforms of the full swing inverter.

The operation of the full swing inverter 170 can be explained as follows. FIG. 12 shows graphs of examples of signal waveforms 202, 204, 206, 208, and 210 that represent the input signal Vin, the output signal Vout, the first voltage V1 at the output node 112 of the first logic unit 110, the second voltage V2 at the output node 136 of the third logic unit 134, and the third voltage V3 at the second end 158 of the capacitor 148, respectively.

When the input signal Vin at the input node 178 is at logic low 212, the output signal Vout at the output node 102 is at logic high and is substantially equal to $V_{DD}$. The transistors 172, 174, and 176 of the first logic unit 172, the second logic unit 174, and third logic unit 176, respectively, are turned on. The transistors MP4, MP5, and MP6 in the voltage level adjuster 142 are also turned on. The second voltage V2 at the gate electrode 128 of the transistor MP3 (122) is near logic high, so the transistor MP3 (122) is turned off. The voltage V1 at the output node 112 of the first logic unit 110, the second voltage V2 at the output 136 of the second logic unit 134, and the third voltage V3 at the second end 158 of the capacitor 148 are smaller than $V_{DD}$, as shown in a first portion 214 of FIG. 12.

When the input signal Vin switches from a logic low state to a logic high state, the transistors 172, 174, and 176 are all turned off. The transistors MP4 (168), MP5 (144), and MP6 (146) are still turned on, the third voltage V3 at the second end 158 of capacitor 148 drops to be lower than $V_{SS}$, as shown in a second portion 216 of FIG. 12. This enables the transistor MP3 (122) to be turned on, pulling the output voltage Vout at the output node 102 to a level substantially equal to $V_{SS}$.

In the example show in FIG. 11, the first logic unit 110, the third logic unit 134, and the voltage level adjuster 130 provide a control signal on the signal line 132 to enable the transistor MP3 (122) of the output buffer 116 to be fully turned on. Because subsequent logic circuits connected to the output node 102 are driven by the second logic unit 118 and the transistor MP3 (122), the size of the first logic unit 110, the third logic unit 134, and the voltage level adjuster 130 can be small and have high impedances. This allows the DC current flowing through the first logic unit 110, the third logic unit 134, and the voltage level adjuster 130 (when they are turned on) to be small, reducing power consumption.

Figure 13A:
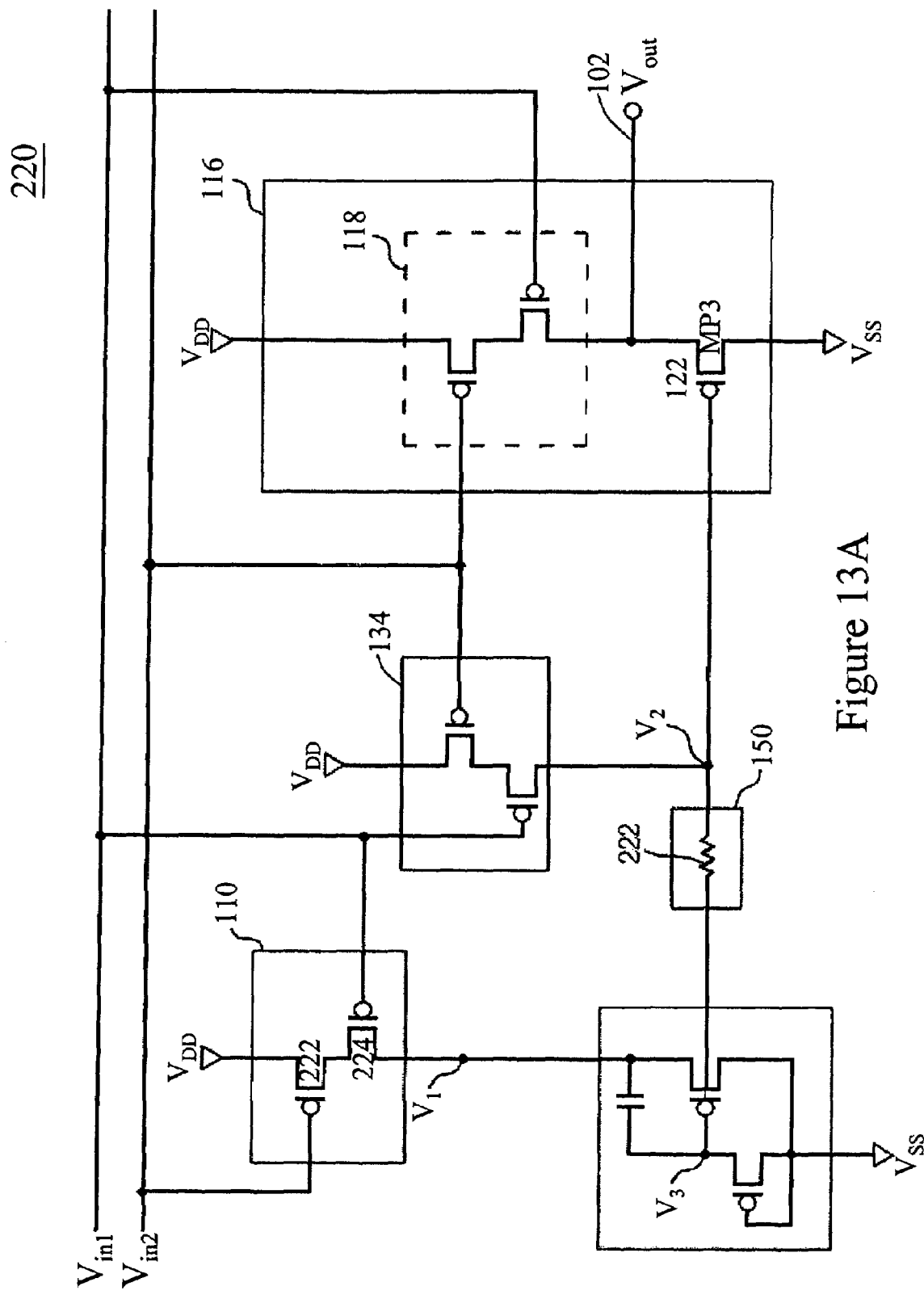
FIGS. 13A and 13B are diagrams of full swing NOR logic circuits.
Figure 13B:
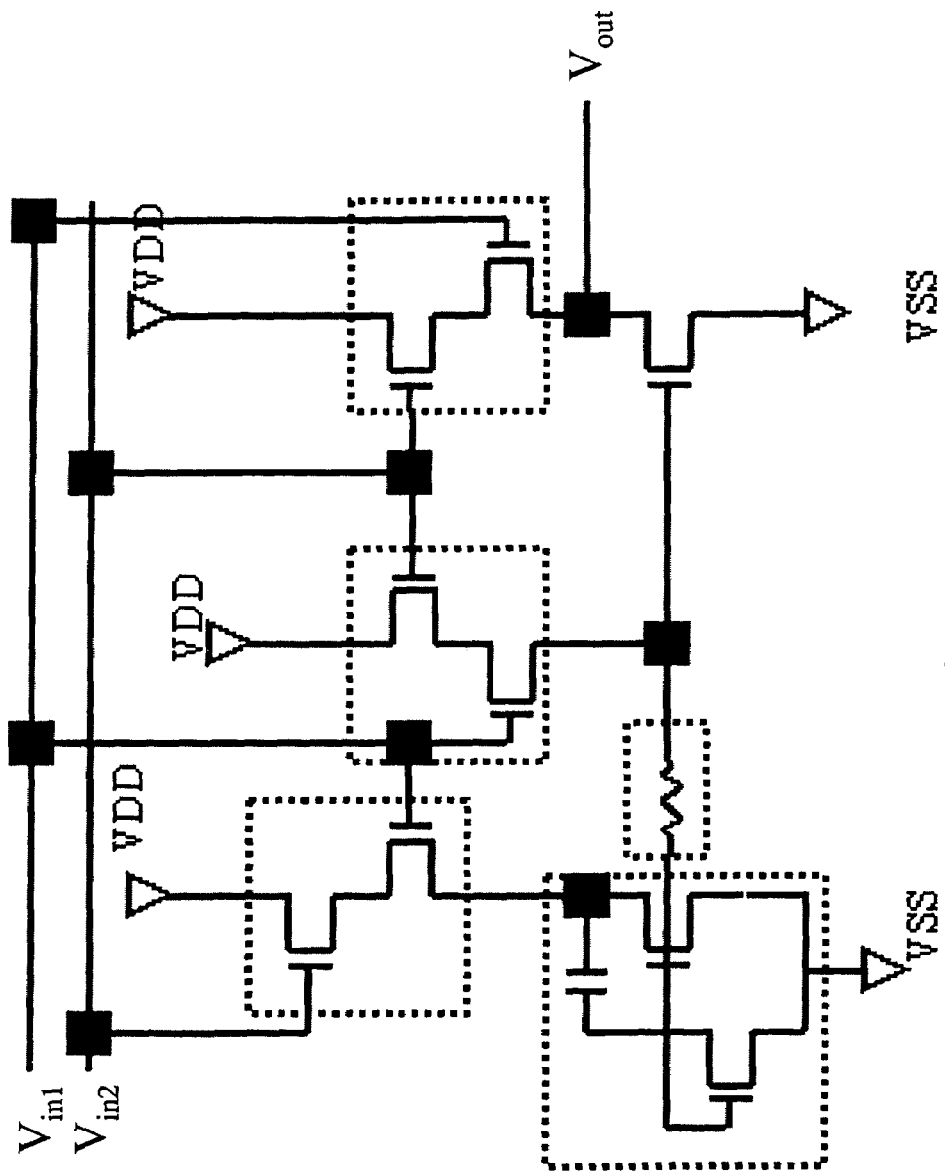

FIG. 13 is a diagram of an example of a full swing NOR logic circuit 220 constructed from PMOS transistors. The full swing NOR circuit 220 can be derived from the circuit 100 (FIG. 10), in which each of the logic units 110, 118, and 134 includes two series-connected PMOS transistors that perform an NOR function on two input signals Vin1 and Vin2 to generate an output signal Vout. For example, the logic unit 110 includes a first transistor 222 that receives a first input signal Vin1 at its gate, and a second transistor 224 that receives a second input signal Vin2 at its gate. The voltage V1 at the output node of the logic unit 110 is high when both inputs Vin1 and Vin2 are low; otherwise the voltage V1 is low. Similarly, the second logic unit 116 pulls the output node 102 to a voltage level substantially equal to $V_{DD}$ when both of the input signals Vin1 and Vin2 are low. In this case, the transistor MP3 (122) in the output buffer 116 is turned off. When any of the input signals Vin1 and Vin2 is high, current does not flow through the second logic unit 116, and the transistor MP3 (122) pulls the output node 102 to a voltage level substantially equal to $V_{SS}$.

Figure 14:
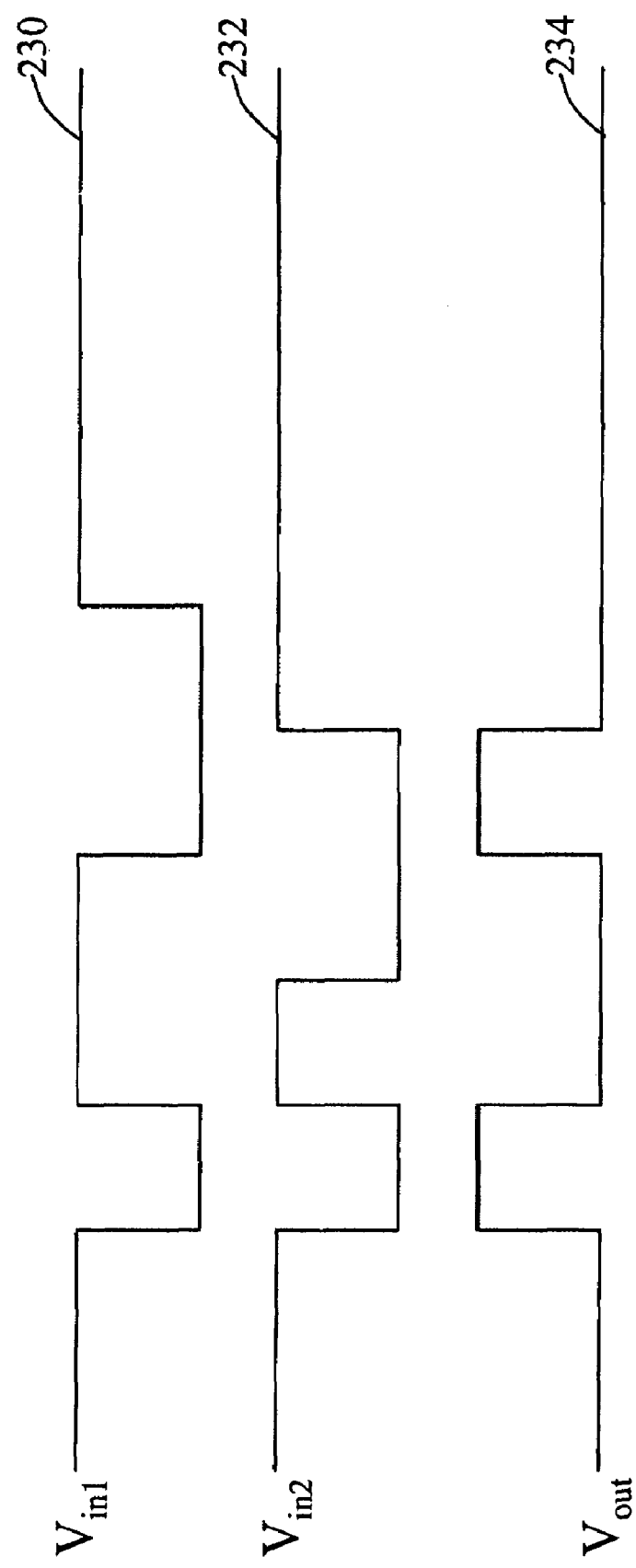
FIG. 14 shows graphs of signal waveforms of the NOR logic circuit.

FIG. 14 shows graphs of examples of signal waveforms 230, 232, and 234 that represent the first input signal Vin1, the second input signal Vin2, and the output signal Vout, respectively, of the full swing NOR logic circuit 220 of FIG. 13. The voltage Vout at the output node 102 of the NOR logic circuit 220 is high when both input signals Vin1 and Vin2 are low. When any of the input signals Vin1 and Vin2 is high, the output voltage Vout is low.

Figure 15A:
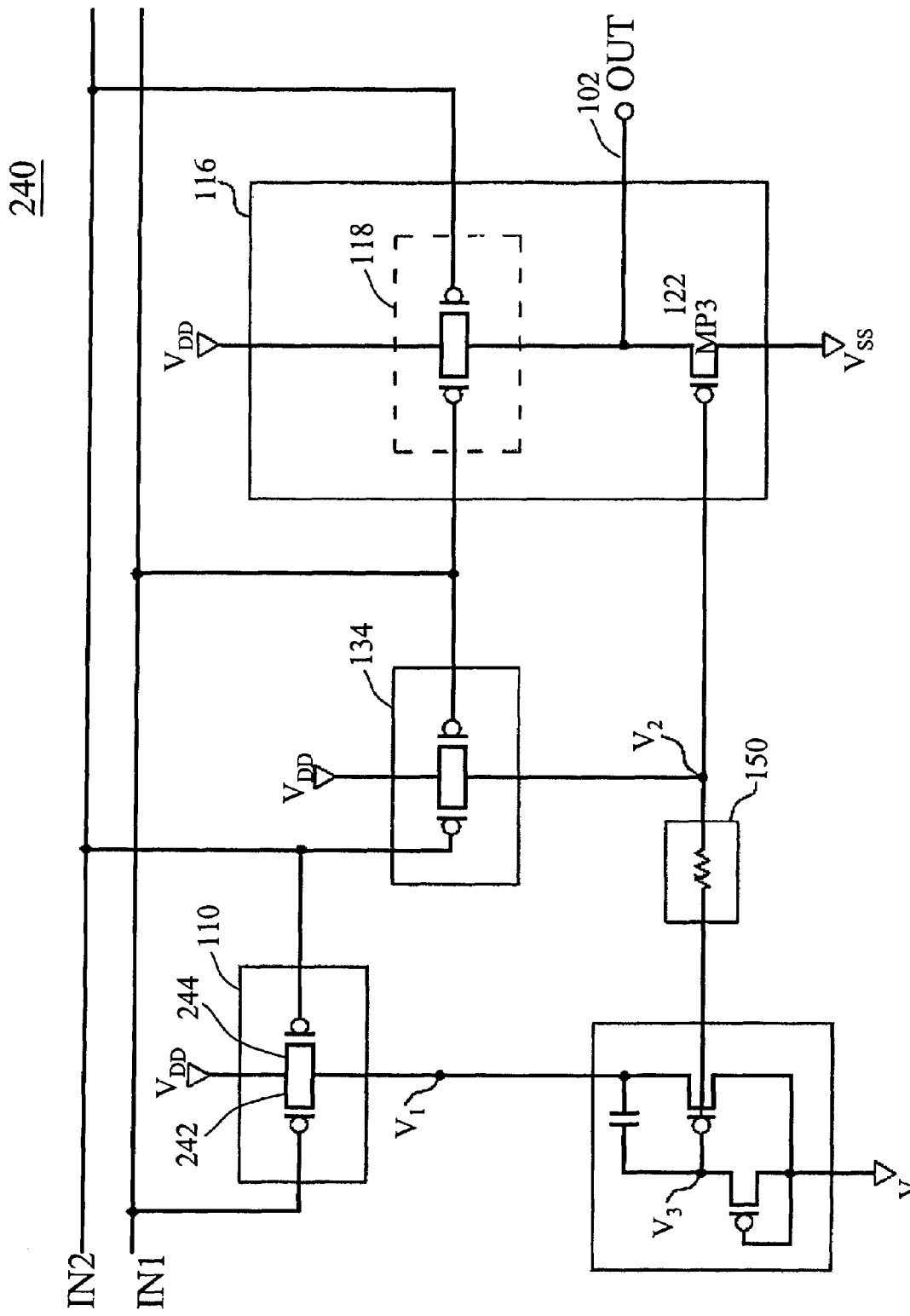
FIGS. 15A and 15B are diagrams of an full swing NAND logic circuits.
Figure 15B:
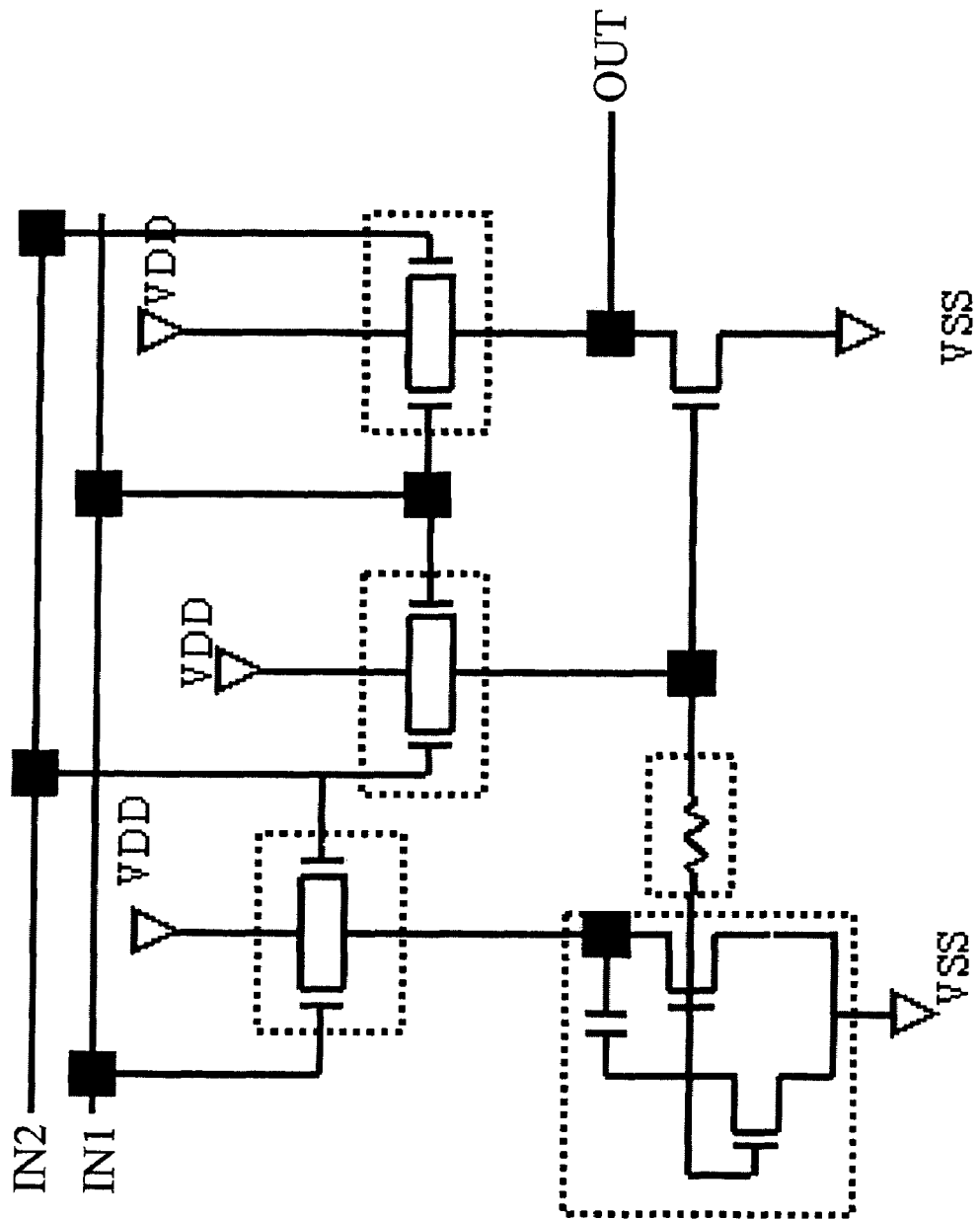

FIG. 15 is a diagram of an example of a full swing NAND logic circuit 240 constructed from PMOS transistors. The full swing NAND circuit 240 can be derived from the circuit 100 (FIG. 10), in which each of the logic units 110, 118, and 134 includes two parallel-connected PMOS transistors that perform an NAND function on two input signals Vin1 and Vin2 to generate an output signal Vout. For example, the logic unit 110 includes a first transistor 242 that receives a first input signal Vin1 at its gate, and a second transistor 244 that receives a second input signal Vin2 at its gate. The voltage V1 at the output node of the logic unit 110 is low when both inputs Vin1 and Vin2 are high; otherwise the voltage V1 is high. Similarly, current does not flow through the second logic unit 116 when both of the input signals Vin1 and Vin2 are high. In this case, the transistor MP3 (122) in the output buffer 116 pulls the output node 102 to a voltage level substantially equal to $V_{SS}$. When any of the input signals Vin1 and Vin2 is low, the second logic unit 116 pulls the output node 102 to a voltage level substantially equal to $V_{DD}$, and the transistor MP3 (122) is turned off.

Figure 16:
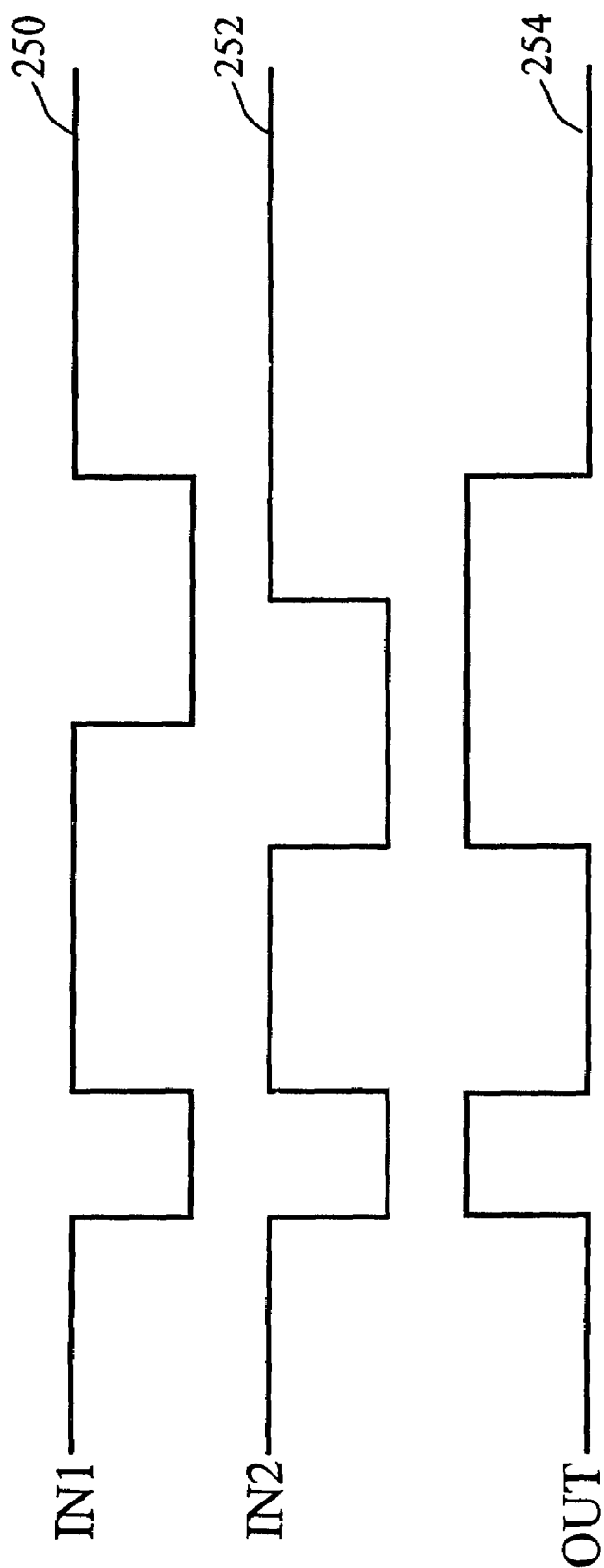
FIG. 16 shows graphs of signal waveforms of the NAND logic circuit.

FIG. 16 shows graphs of examples of signal waveforms 250, 252, and 254 that represent the first input signal Vin1, the second input signal Vin2, and the output signal Vout, respectively, of the full swing NAND logic circuit 240 of FIG. 14. The voltage Vout at the output node 102 of the NAND logic circuit 240 is low when both input signals Vin1 and Vin2 are high. When any of the input signals Vin1 and Vin2 is low, the output signal Vout is high.

Figure 17A:
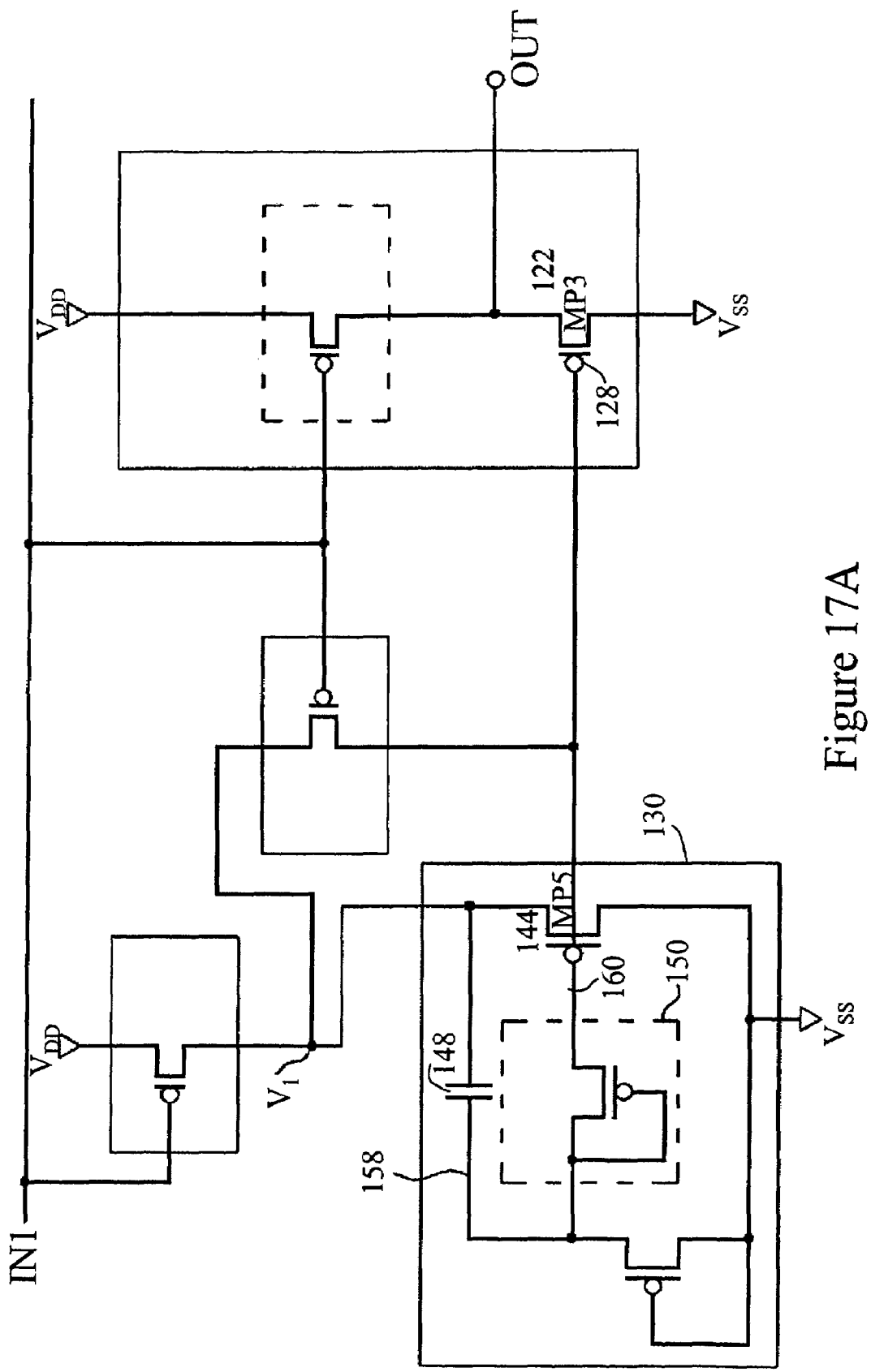
FIGS. 17A-23B are diagrams of logic circuits.
Figure 17B:
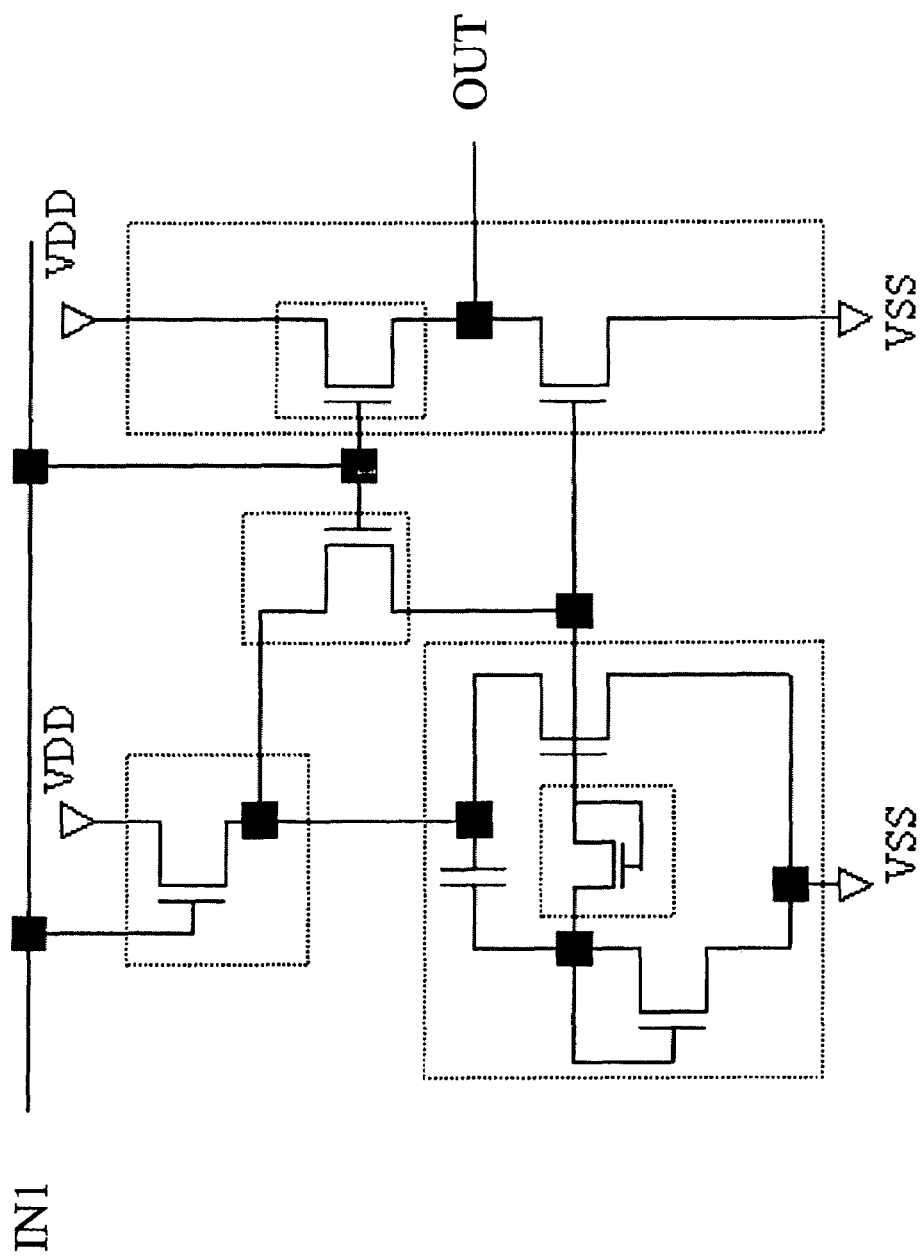

In the examples shown in FIGS. 10, 11, 13, and 15, the impedance element 150 is connected between the second node 158 of the coupling capacitor 148 and the gate 128 of the transistor MP3 (122). Referring to FIG. 17, in some examples, the impedance element 150 can be connected between the second node 158 and the gate 160 of the transistor MP5 (144). The gate 160 of the transistor MP5 (144) is connected to the gate 128 of the transistor MP3 (122).

Figure 18:
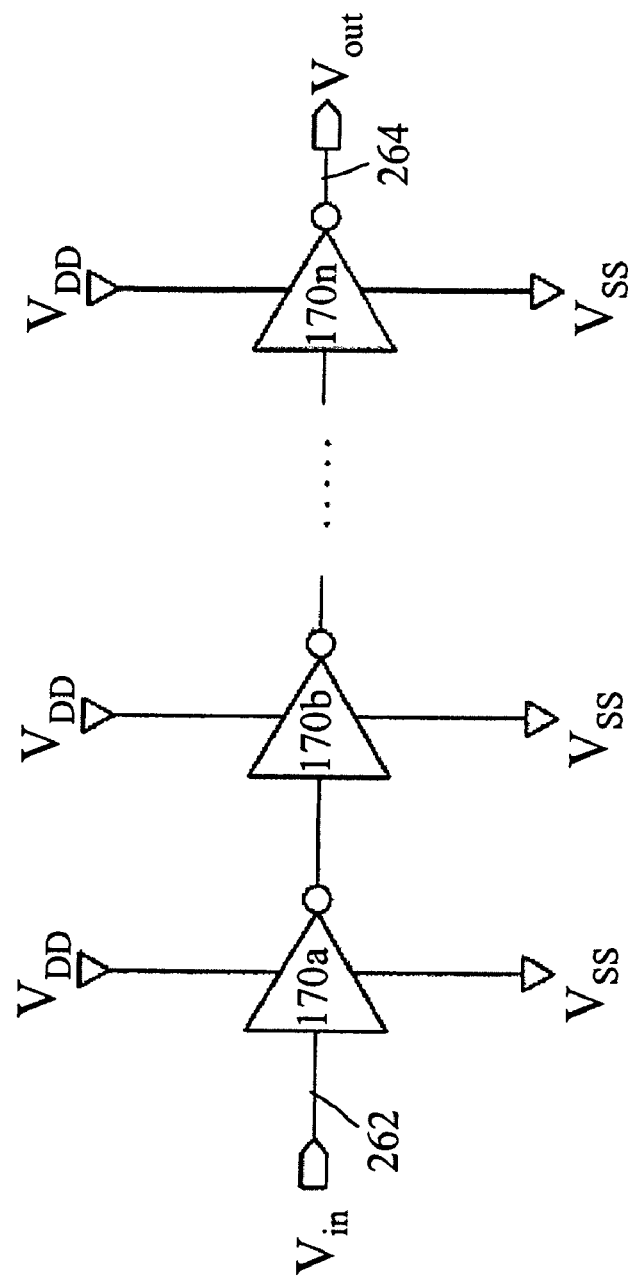

The full swing inverter 170 of FIG. 11 can be connected in stages to provide phase adjustment and increase driving capability. FIG. 18 is a diagram of an example of a logic circuit 260 that includes several full swing inverters 170a, 170b, ..., 170n (collectively referenced as 170) that are connected in stages. There is a phase delay from the input node 178 to the output node 102 of each inverter. The total phase delay from the input node 262 to the output node 264 of the circuit 260 can be adjusted by changing the number of stages of the inverters. To increase the driving capability of the logic circuit 260, the inverter of each successive stage can use transistors that have larger width-to-length (W/L) ratios than those in the inverter of a previous stage. This allows the inverter 170n of the last stage to provide a large driving capability. By increasing the W/L ratios of transistors in stages, the circuit 260 can have a small loading effect on the circuit driving the input node 262.

Logic circuits other than inverters (e.g., latch circuits and shift registers) can also be connected in stages.

Figure 19:
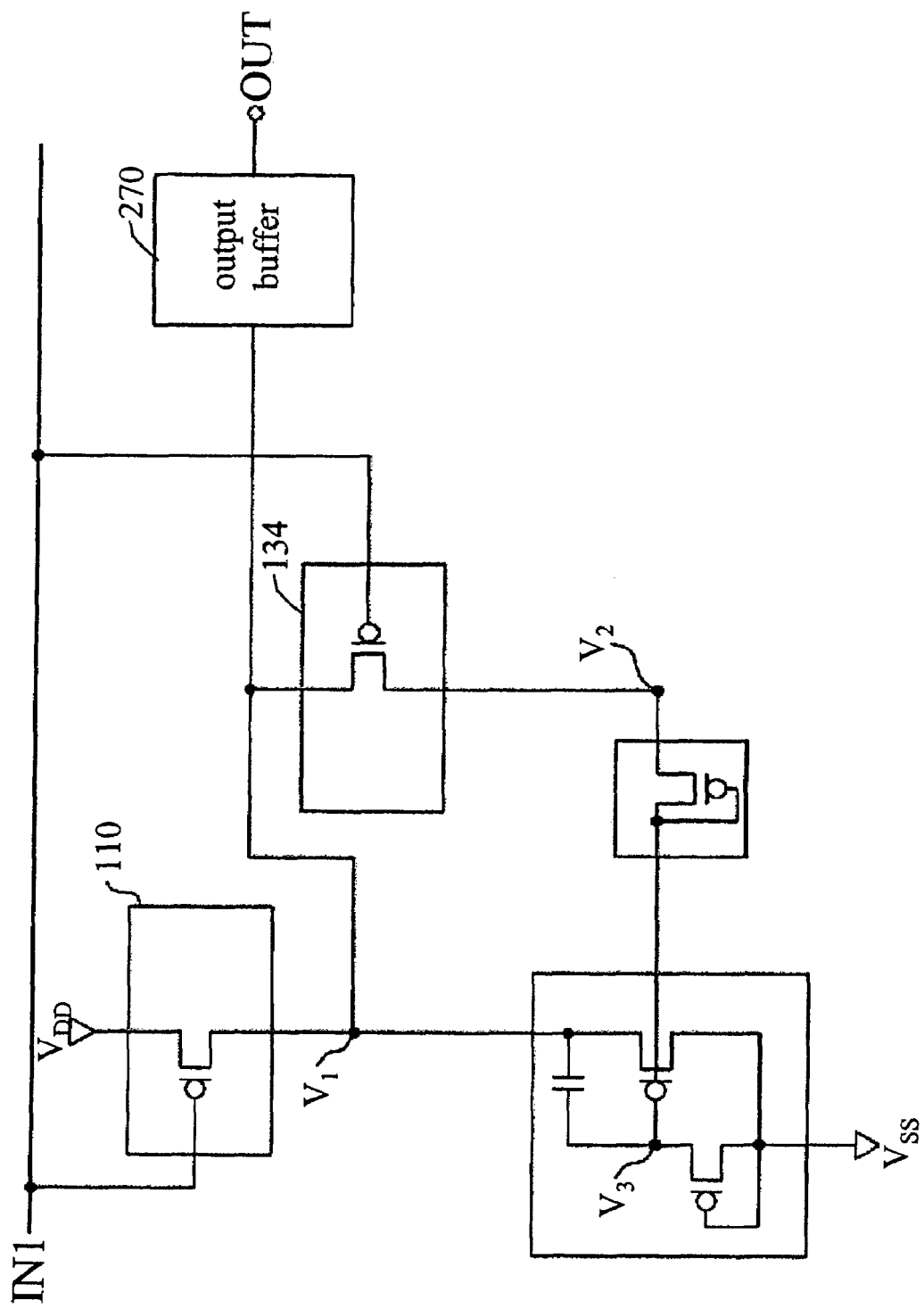

In the examples described above, the logic circuits 170 (FIG. 11), 220 (FIG. 13), and 240 (FIG. 15) each includes a full swing output buffer 116. The full swing output buffer 116 can be replaced by other types of buffer 270, as shown in FIG. 19.

Figure 20A:
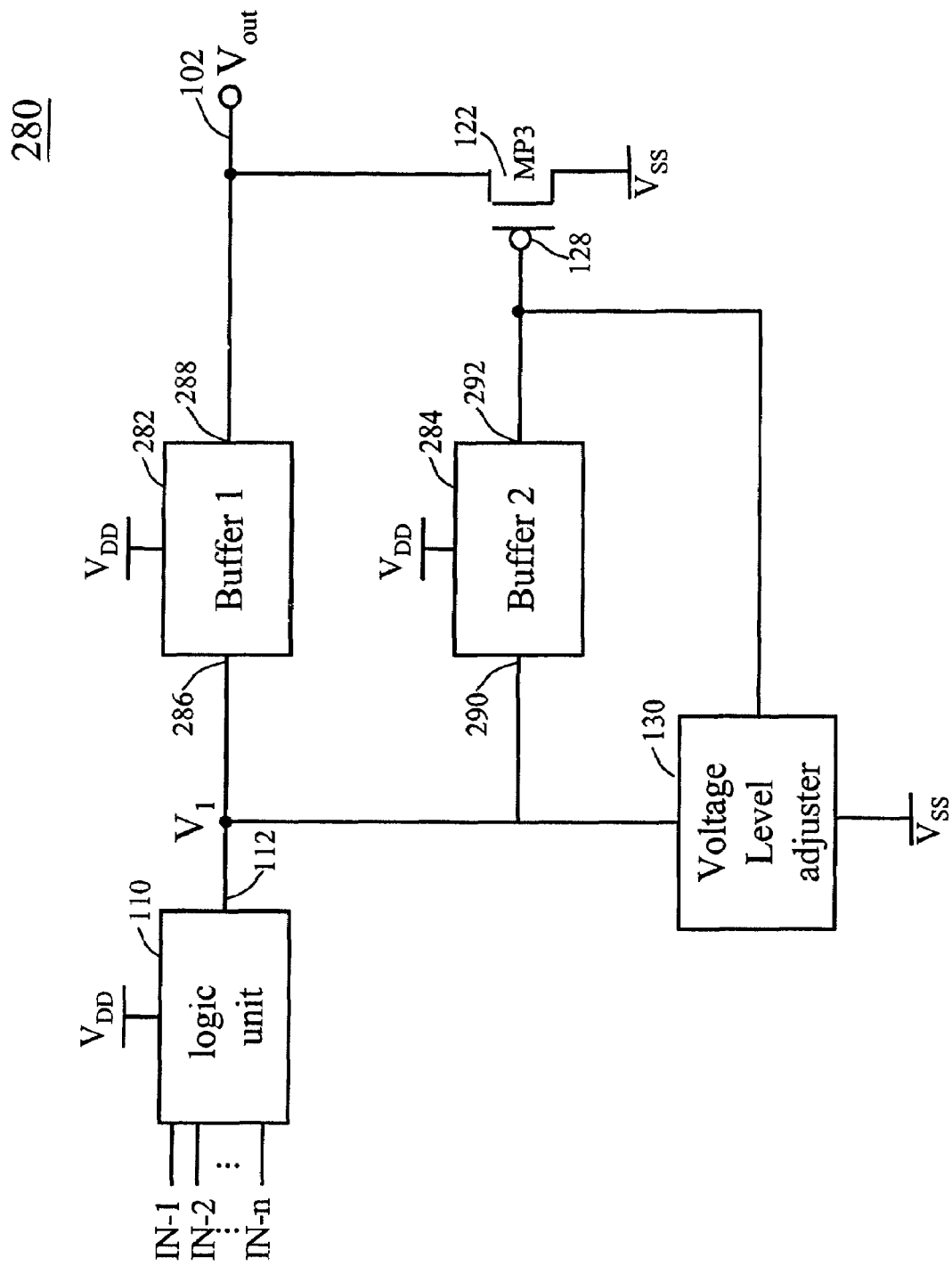
Figure 20B:
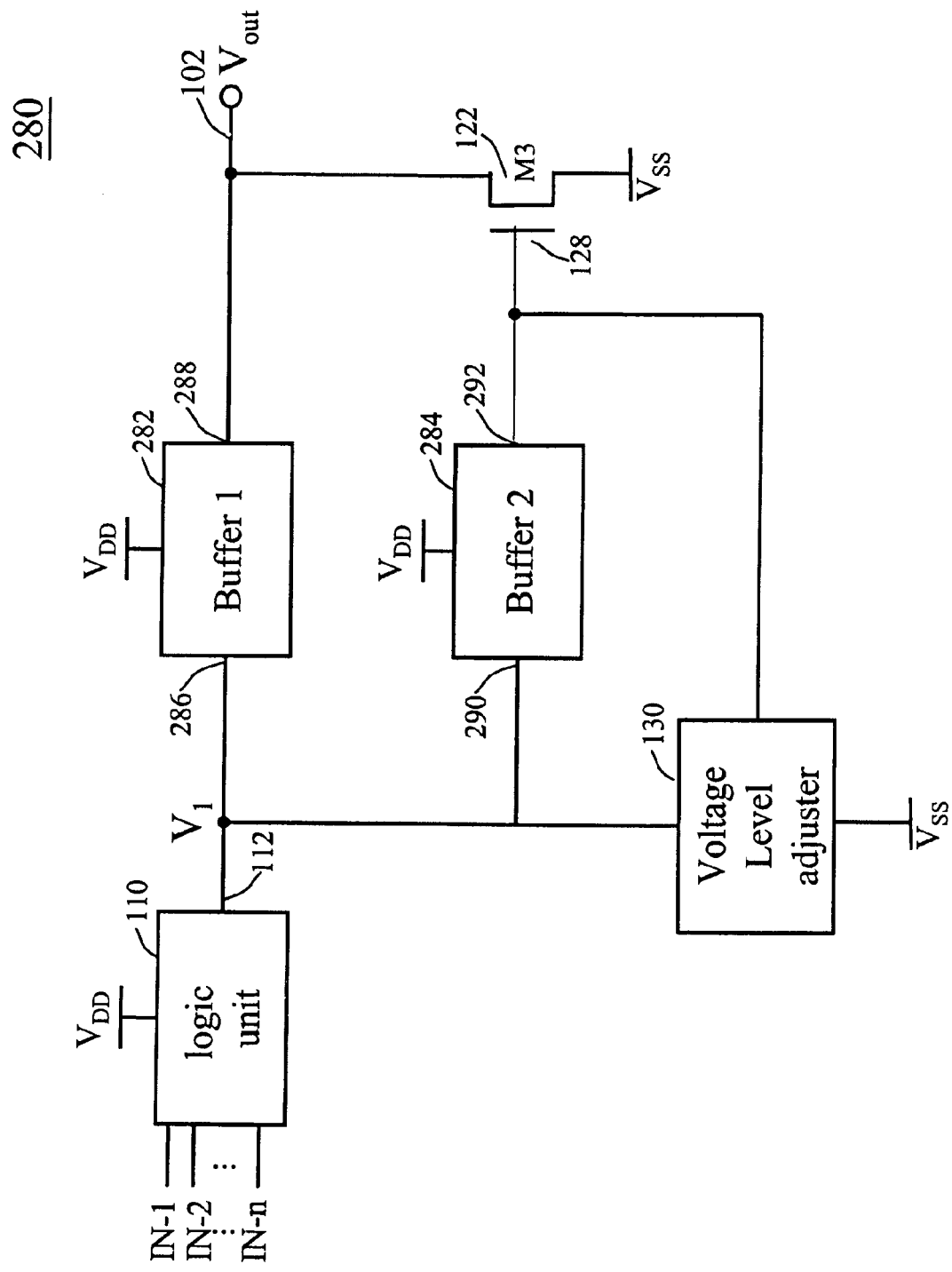

FIG. 20 is a diagram of an example of a full swing logic circuit 280 that is constructed from PMOS transistors and can generate a full swing output signal on an output node 102. The logic circuit 280 includes a logic unit 110, a voltage level adjuster 130, and a transistor MP3 (122), similar to those in FIG. 10. The logic circuit 280 also includes a first buffer 282 and a second buffer 284. The first buffer 282 has an input node 286 coupled to an output node 112 of the logic unit 110, and an output node 288 coupled to the output node 102 of the logic circuit 280. The second buffer 284 has an input node 290 coupled to the output node 112 of the logic unit 110, and an output node 292 coupled to a gate 128 of the transistor MP3 (122).

When the output node 112 of the logic unit 110 is high, the first buffer 282 pulls the output node 102 to a logic high state having a voltage level substantially equal to $V_{DD}$. The second buffer 284 pulls the gate 128 of the transistor MP3 (122) to a logic high state, turning off the transistor MP3 (122).

When the output node 112 of the logic unit 110 is low, the first buffer 282 and the second buffer 284 have low output voltage levels. The voltage level adjuster 130 pulls the gate 128 of the transistor MP3 (122) to be lower than $V_{SS}$, causing the transistor MP3 (122) to drive the output node 102 to $V_{SS}$.

Figure 21A:
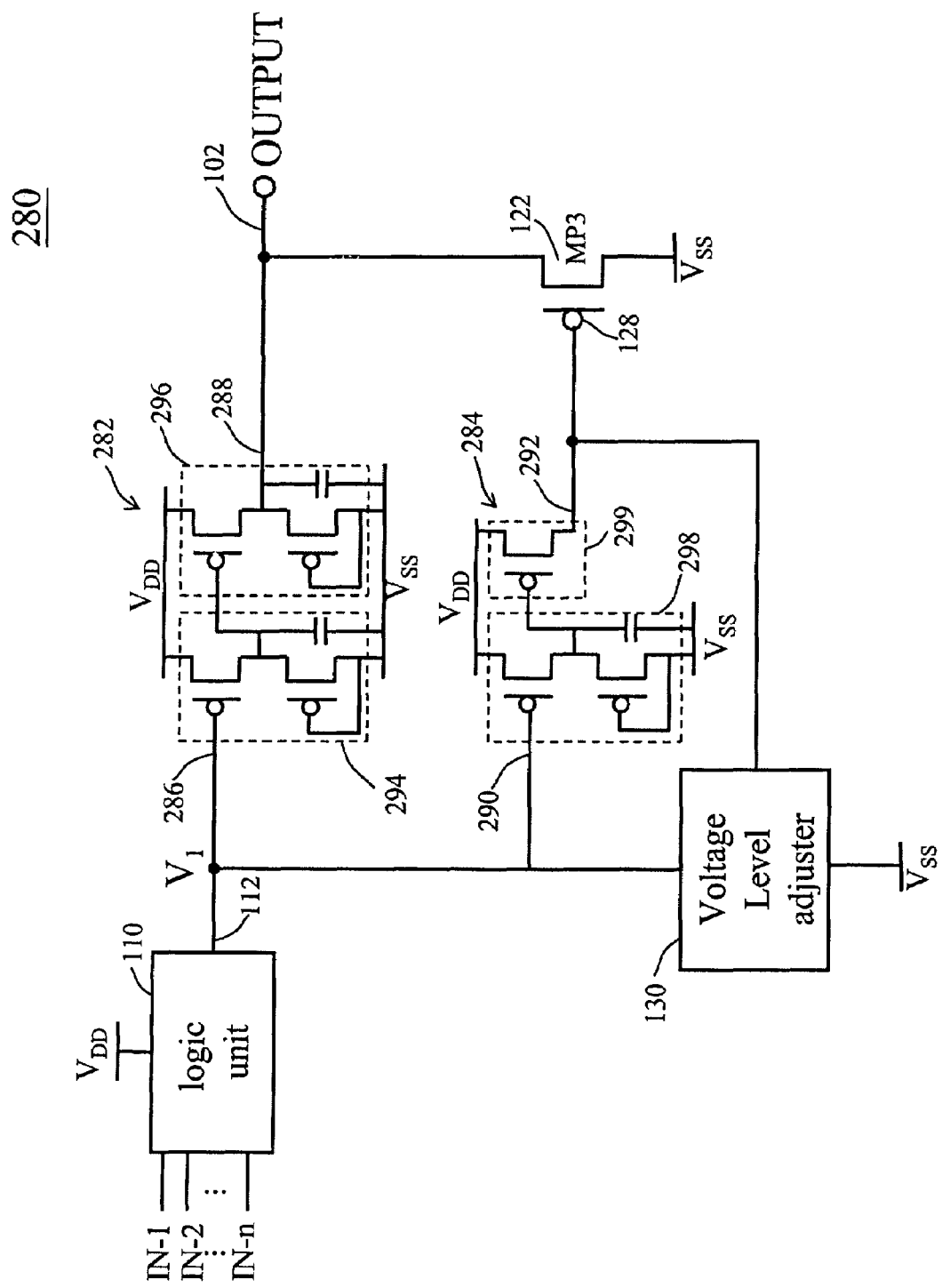
Figure 21B:
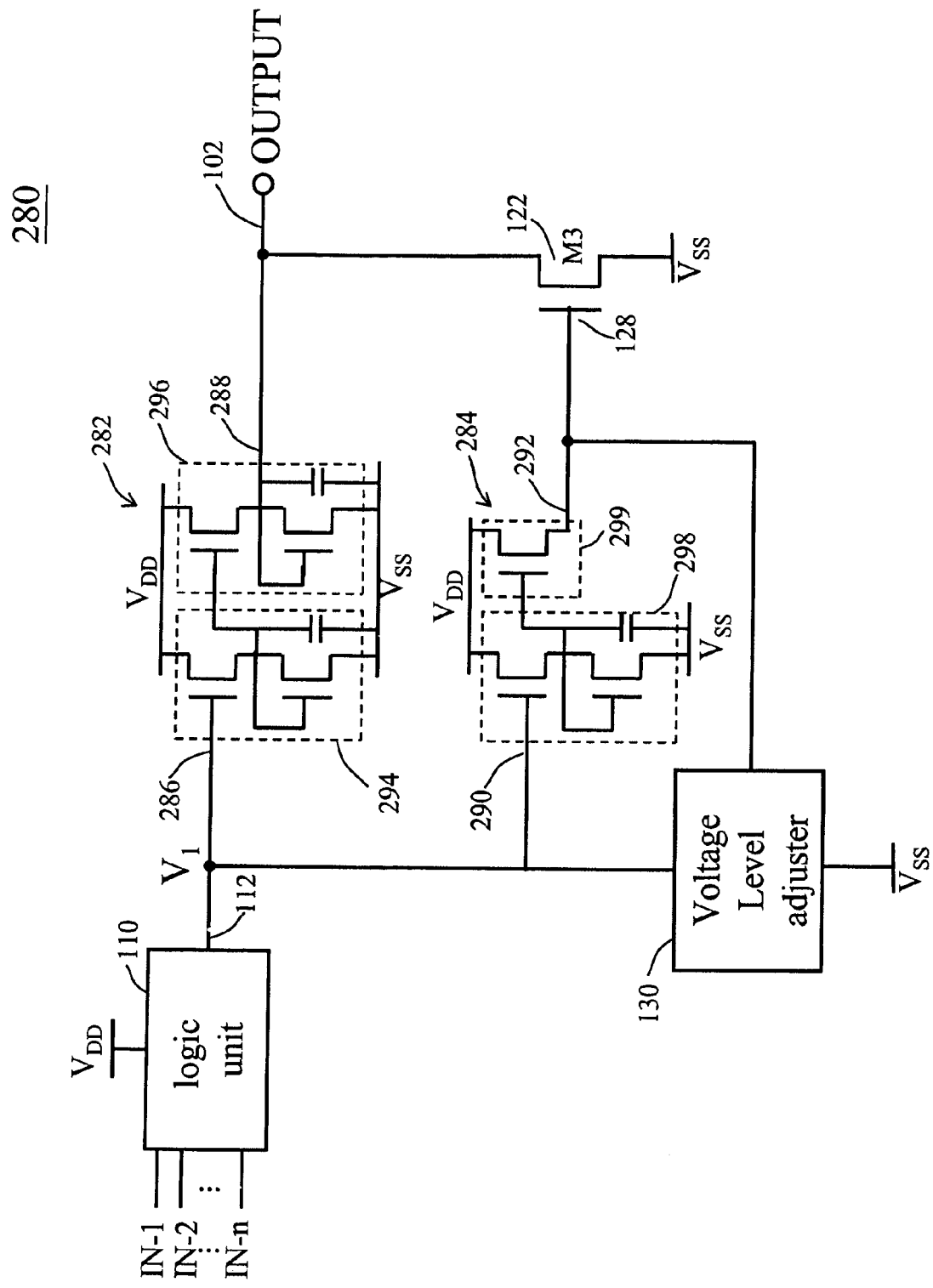

FIG. 21 is a diagram of an example of the full swing logic circuit 280 in FIG. 20, showing the details of the first and second buffers 282 and 284. The first buffer 282 includes a first inverter 294 and a second inverter 296. The second buffer 284 includes a first inverter 298 and a second inverter 299. In the first buffer 282, the first inverter 294 can use small transistors to reduce current when the output node 112 of the logic unit 110 is low, while the second inverter 296 can use larger transistors to have larger driving capability. The second buffer 284 can use small transistors because the second buffer 284 does not directly drive the output node 102.

Figure 22A:
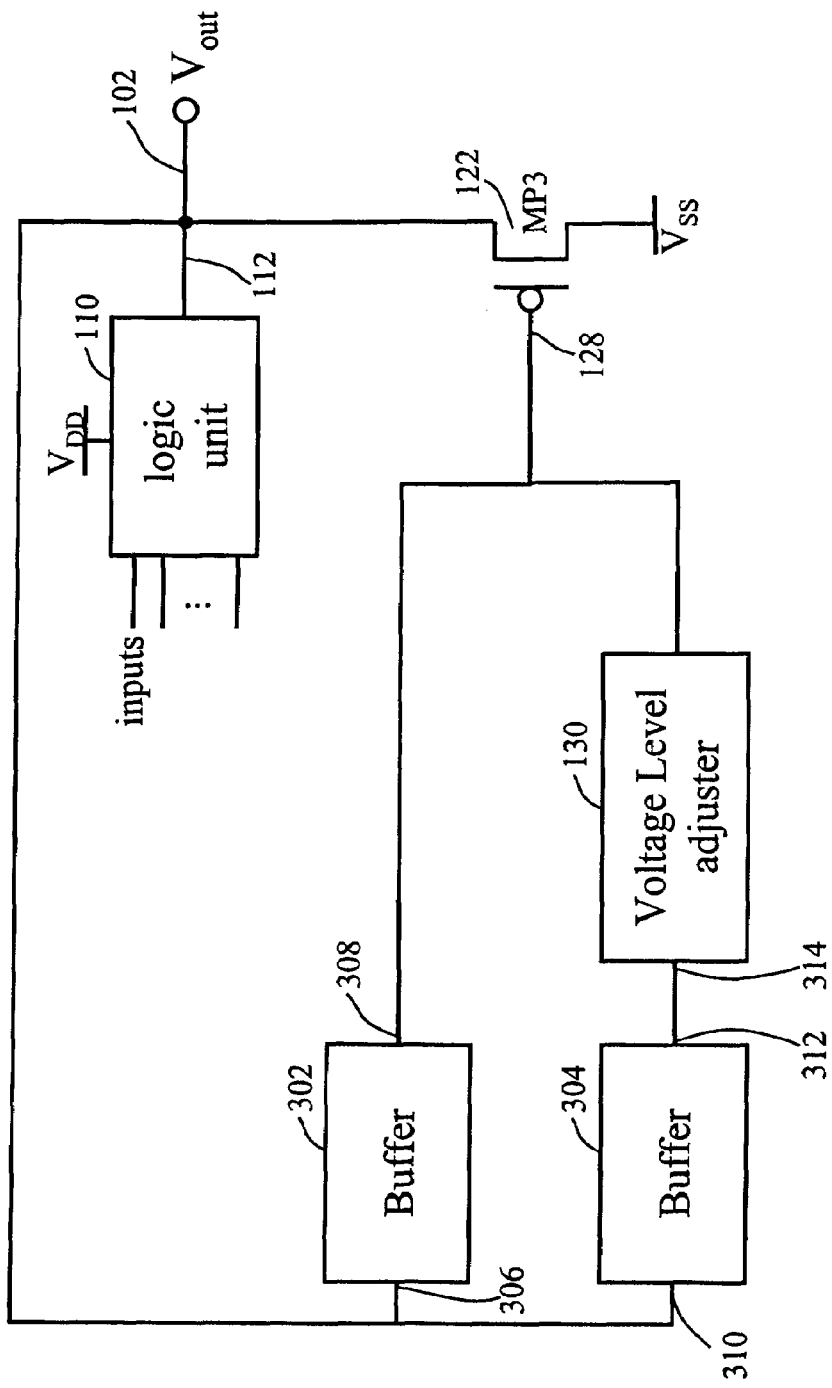
Figure 22B:
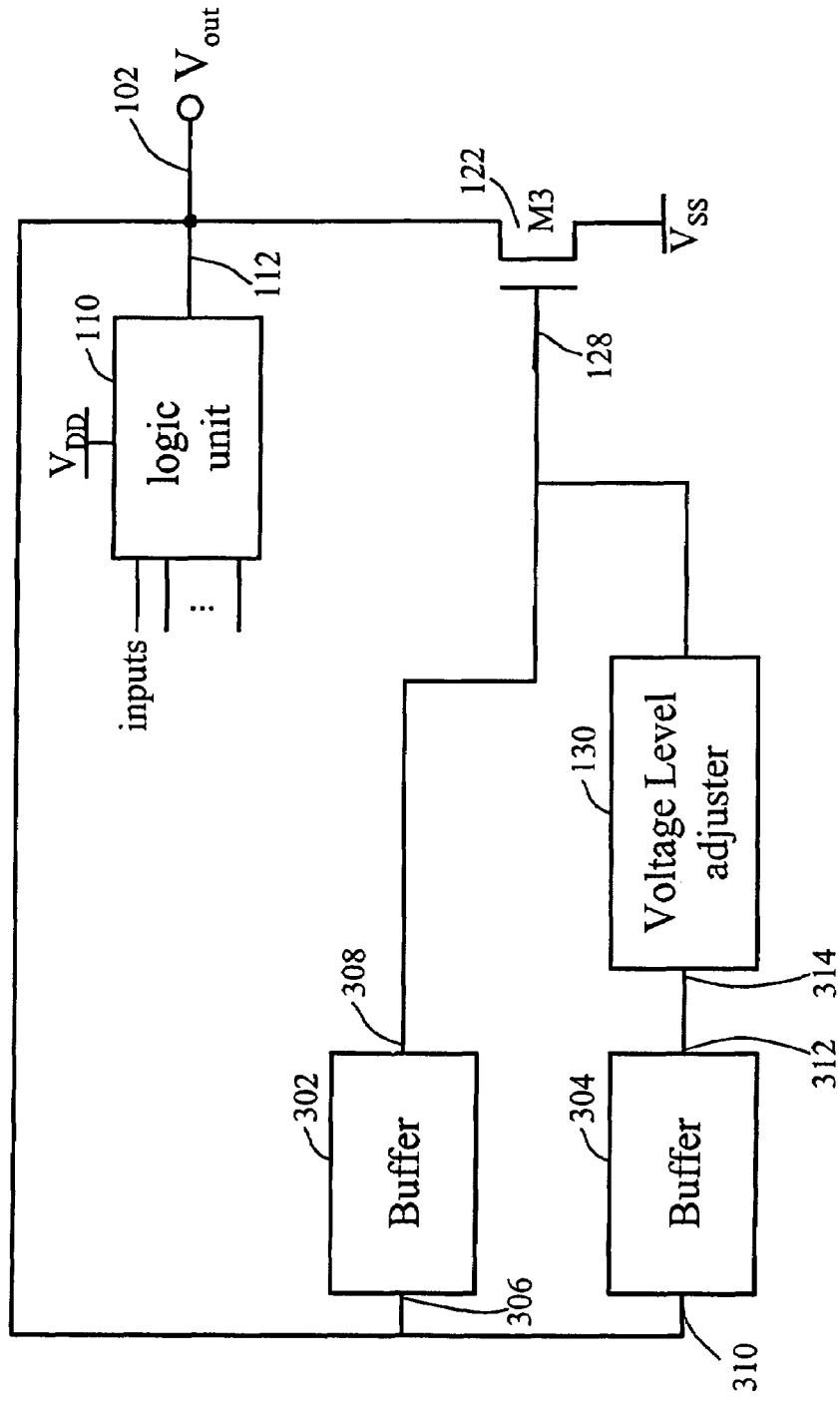

FIG. 22 is a diagram of an example of a full swing logic circuit 300 that is constructed from PMOS transistors and can generate a full swing output signal on an output node 102. The logic circuit 300 includes a logic unit 110, a voltage level adjuster 130, and a transistor MP3 (122), similar to those in FIG. 20. The output node 112 of the logic unit 110 is used to drive the output node 102 of the logic circuit 300. The logic circuit 300 includes a first buffer 302 and a second buffer 304. The first buffer 302 has an input node 406 that is coupled to the output node 112 of the logic unit 110, and an output node 308 that is coupled to the gate 128 of the transistor MP3 (122). The second buffer 304 has an input node 310 that is also coupled to the output node 112 of the logic unit 110, and an output node 312 that is coupled to an input node 314 of the voltage level adjuster 130.

When the output node 112 of the logic unit 110 is high, the logic unit 110 pulls the output node 102 to a logic high state having a voltage level substantially equal to $V_{DD}$. The logic unit 110 is configured to have sufficient driving power to pull the output node 102 to the logic high state. At the same time, the first buffer 282 pulls the gate 128 to a logic high state, turning off the transistor MP3 (122).

When the output node 112 of the logic unit 110 is low, the second buffer 284 has a low output voltage level, causing the voltage level adjuster 130 to pull the gate 128 of the transistor MP3 (122) to be lower than $V_{SS}$, enabling the transistor MP3 (122) to drive the output node 102 to $V_{SS}$.

Figure 23A:
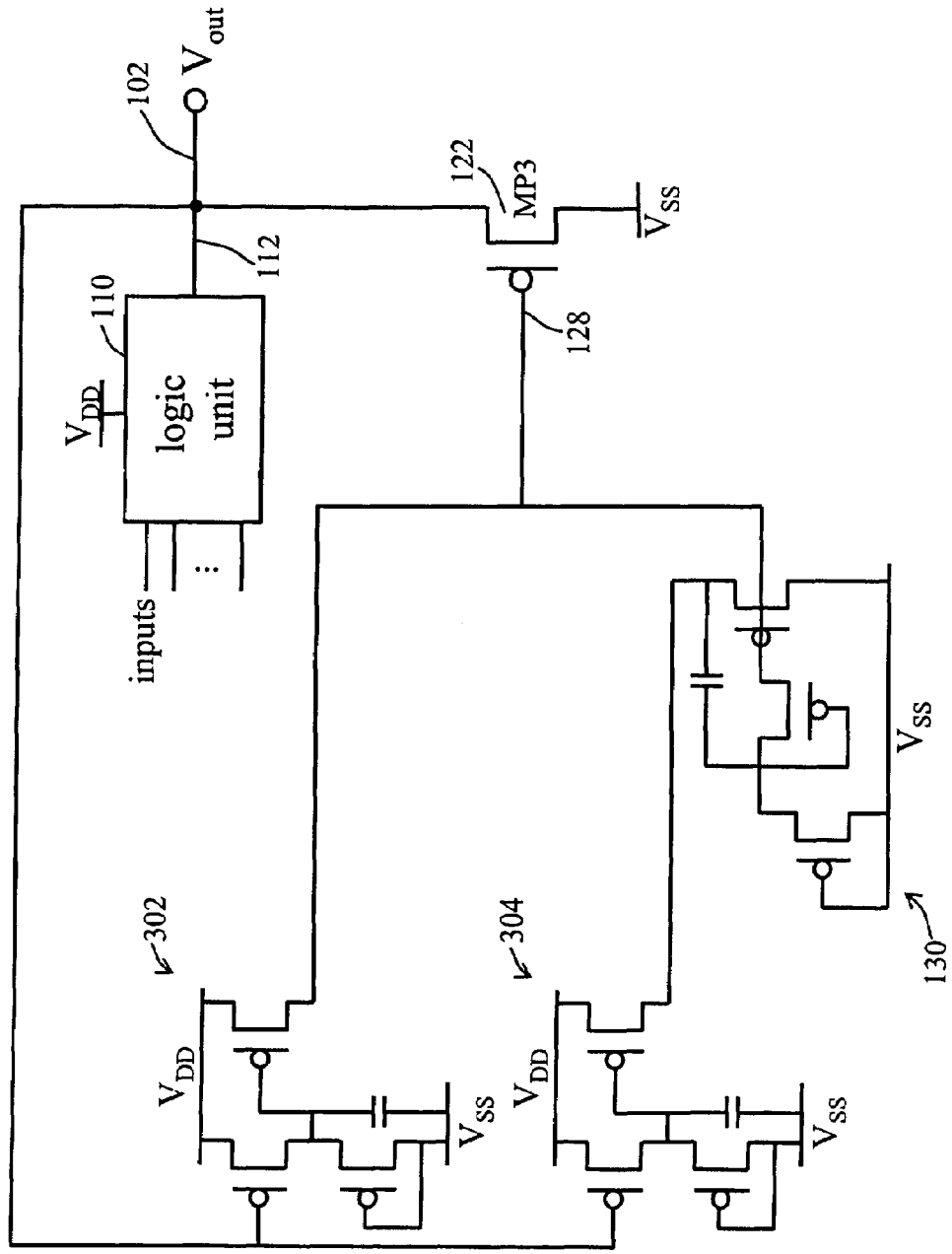
Figure 23B:
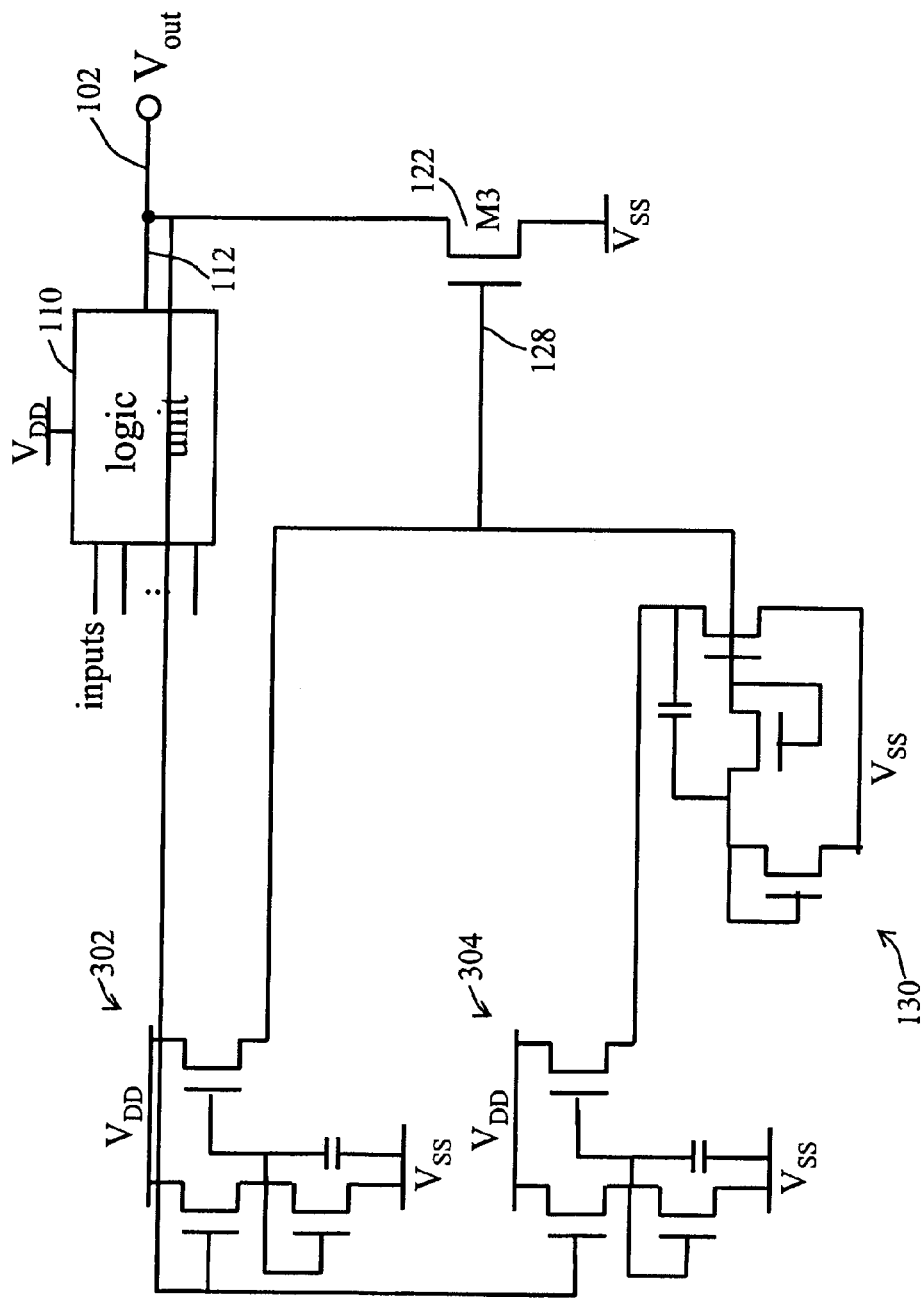

FIG. 23 is a diagram of an example of the full swing logic circuit 300 in FIG. 22, showing the details of the first and second buffers 302 and 304. The first and second buffers 302 and 304 can use small transistors because the buffers do not directly drive the output node 102.

Advantages of the full swing logic circuits 280 and 300 include one or more of the following. If the logic unit 110 has more than four transistors, then using the first and second buffers (e.g., 282, 284 or 302, 304) can result in a smaller number of transistors, as compared to the full swing logic circuit 100 in FIG. 10.

Figure 24:
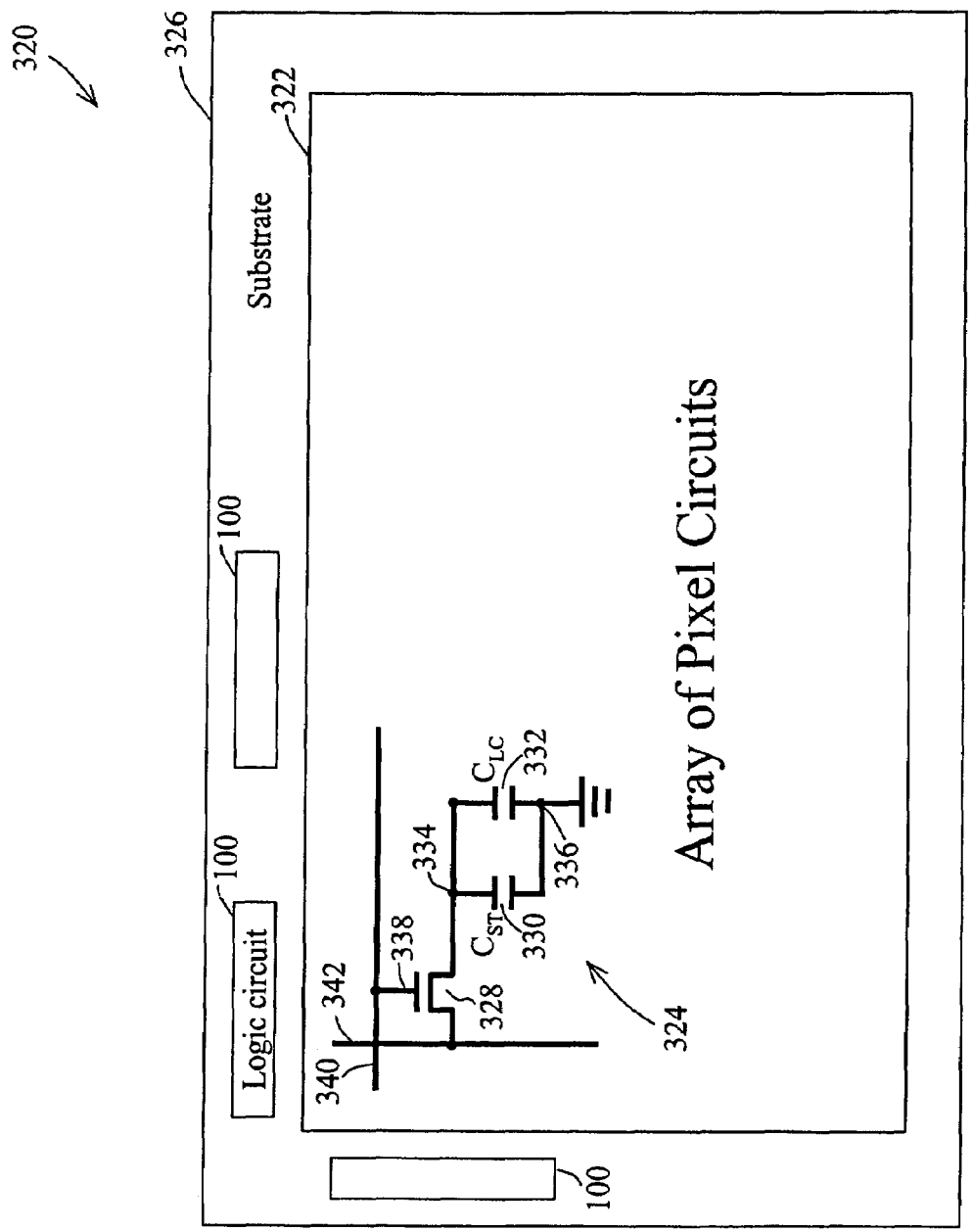
FIG. 24 is a diagram of the display.

FIG. 24 is a diagram of an example of a display 320 having one or more full swing logic circuits 100 and an array 322 of pixel circuits 324 fabricated on a substrate 326. The logic circuits 100 and the array 322 can be on the same side of the substrate 326, on different sides of the substrate 326, or both. Each of the logic circuits 100 can be similar to the one shown in FIG. 10.

The circuits 324 can be controlled by one or more gate drivers and one or more data drivers. In some examples, the gate drivers and data drivers can include some of the full swing logic circuits 100. Each pixel circuit 324 includes one or more thin film transistors (TFT) 328, a storage capacitor $C_{ST}$ 330, and a liquid crystal cell (not shown). The gate drivers and data drivers include the same type of transistor as the transistors of the pixel circuits 324. The logic circuits 100 may provide other functions, such as generating a pulse width signal for controlling a backlight module (not shown), generating gate pulses for turning on or off the TFT 328, and generating data signals for each pixel circuit 324.

The liquid crystal cell of the pixel circuit 324 has an effective capacitance, represented by $C_{LC}$ 332. The capacitors $C_{ST}$ 330 and $C_{LC}$ 332 can be, e.g., connected in parallel to a first node 334 and a second node 336. The TFT 328 includes a gate 338 that is connected to a gate line 340, which is connected to a gate driver. When the gate driver drives the gate line 340 to turn on the TFT 328, the data driver simultaneously drives a data line 342 with a voltage signal (e.g., Vdata), which is passed to the capacitors $C_{ST}$ 330 and $C_{LC}$ 332.

In some examples, the first and second nodes 334 and 336 are connected to two transparent electrodes, respectively, that are positioned on two sides of the liquid crystal cell. The voltage (e.g., Vdata) held by the capacitors $C_{ST}$ 330 and $C_{LC}$ 332 determines the voltage applied to the liquid crystal cell. The voltage on the data line 342 is sometimes referred to as a "pixel voltage" or "gray scale voltage" because it determines the gray scale level shown by the pixel circuit 324.

Each pixel of the display 320 includes three sub-pixels for displaying red, green, and blue colors. Each sub-pixel includes a pixel circuit 324. By controlling the gray scale levels of the three sub-pixels, each pixel can display a wide range of colors and gray scale levels.

A number of embodiments of the invention have been described. Other implementations are also within the scope of the following claims. For example, the input voltage reference node 280 of the third logic unit 238 can be connected to the first voltage reference $V_{DD}$ instead of to the output node 244 of the second logic unit 236. The transistor MP4 (168) in FIG. 10 can be replaced by a resistor. The drain 188 of the transistor 176 in FIG. 11 can be connected to $V_{DD}$ instead of the source 182 of the transistor 172. In the examples shown in FIGS. 10 and 11, the transistors in the logic circuits 100 and 170 are PMOS transistors. In some examples, full swing logic circuits can also be constructed using NMOS transistors. The logic units 110, 118, and 134 do not necessarily receive input signals. For example, the logic units 110, 118, and 134 can be configured to generate predetermined waveforms after power up. Accordingly, other implementations and applications are also within the scope of the following claims.

What is claimed is:

1. An apparatus comprising:
a logic circuit comprising
a first logic unit comprising an output node having a logic state, the first logic unit being coupled to a first voltage reference,
a driving unit comprising an input node, the driving unit being coupled to a second voltage reference, the driving unit and the first logic unit being constructed from a single type of transistor, and
a voltage level adjuster to provide, to the input node of the driving unit, a control signal that has a first voltage level that causes the driving unit to reduce a current flowing through the driving unit when the output node of the first logic unit has a first logic state, and has a second voltage level that causes the driving unit to drive an output node of the logic circuit to a voltage level substantially equal to that of the second voltage reference when the output node of the first logic unit has a second logic state.

2. The apparatus of claim 1 wherein the logic circuit is configured such that the output node of the logic circuit has a voltage level substantially equal to that of the first voltage reference when the output node of the first logic unit has the first logic state.

3. The apparatus of claim 1 wherein the driving unit comprises a transistor comprising a gate, a drain, and a source, the gate being coupled to the input node of the driving unit, the drain being coupled to the output node of the driving unit, the source being coupled to the second voltage reference.

4. The apparatus of claim 1 wherein the output node of the first logic unit is coupled to the output node of the driving unit.

5. The apparatus of claim 4, further comprising a second logic unit configured to perform a same logic function as the first logic unit, the second logic unit having an output node that is coupled to an input node of the voltage level adjuster.

6. The apparatus of claim 5, further comprising a third logic unit configured to perform a same logic function as the first logic unit, the third logic unit having an output node that is coupled to the input node of the driving unit.

7. The apparatus of claim 4, further comprising a second logic unit configured to perform a same logic function as the first logic unit, the second logic unit having an output node that is coupled to the input node of the driving unit.

8. The apparatus of claim 1 wherein the output node of the first logic unit is coupled to an input node of the voltage level adjuster.

9. The apparatus of claim 1, further comprising a first buffer comprising an input node and an output node, the input and output nodes of the first buffer having a same logic state, the input node of the first buffer being coupled to the output node of the first logic unit, and the output node of the first buffer being coupled to the output node of the driving unit.

10. The apparatus of claim 9, further comprising a second buffer comprising an input node and an output node, the input and output nodes of the second buffer having a same logic state, the input node of the second buffer being coupled to the output node of the first logic unit, and the output node of the second buffer being coupled to the input node of the driving unit.

11. The apparatus of claim 9, further comprising a second buffer comprising an input node and an output node, the input and output nodes of the second buffer having a same logic state, the input node of the second buffer being coupled to the output node of the first logic unit, and the output node of the second buffer being coupled to an input node of the voltage level adjuster.

12. The apparatus of claim 9 wherein the first buffer comprises a second logic unit configured to perform a same logic function as the first logic unit.

13. The apparatus of claim 9 wherein the output node of the first logic unit is coupled to an input node of the voltage level adjuster.

14. The apparatus of claim 9, further comprising a second logic unit configured to perform a same logic function as the first logic unit, the second logic unit having an output node that is coupled to the input node of the driving unit.

15. The apparatus of claim 1 wherein the second voltage reference has a voltage level lower than that of the first voltage reference, and the voltage level adjuster is configured to set the control signal to a voltage level lower than that of the second voltage reference when the output node of the first logic unit has the second logic state.

16. The apparatus of claim 15 wherein the first logic unit and the driving unit comprise PMOS transistors 17. The apparatus of claim 1 wherein the second voltage reference has a level higher than that of the first voltage reference, and the voltage level adjuster is configured to set the control signal to a voltage level higher than that of the second voltage reference when the output signal of the first logic unit has the second logic state.

18. The apparatus of claim 17 wherein the first logic unit and the driving unit comprise NMOS transistors.

19. The apparatus of claim 1 wherein the first logic unit is configured to perform a logic function comprising at least one of AND, NAND, OR, NOR, XOR, and NOT.

20. The apparatus of claim 1 wherein the first logic unit comprises at least one input node to receive at least one input signal, and is configured to perform a function equivalent to at least one of a counter, a shift register, and a programmable pulse width signal generator.

21. The apparatus of claim 1 wherein the voltage level adjuster comprises a coupling capacitor that maintains a voltage across the coupling capacitor when the output node of the first logic unit switches from the first logic state to the second logic state.

22. The apparatus of claim 1 wherein the voltage level adjuster is configured to set the control signal to a voltage level that turns off the driving unit when the output node of the first logic unit is at the first logic state.

23. The apparatus of claim 1, further comprising a power supply for providing the first voltage reference and the second voltage reference.

24. A full swing logic circuit comprising:
a driving unit comprising an input node, the driving unit being coupled to a first voltage reference, and
a logic unit comprising an output node having a logic state, the logic unit being coupled to a second voltage reference, the logic unit driving the output node to a voltage level substantially equal to that of the first voltage reference when the output node is at a first logic state,
the logic unit providing to the driving unit a control signal that has a first voltage level that causes the driving unit to reduce a current flowing through the driving unit when the output node of the first logic unit has the first logic state, and has a second voltage level that causes the driving unit to drive the output node of the logic unit to a voltage level substantially equal to that of the second voltage reference when the output node of the first logic unit has a second logic state,
the driving unit and the first logic unit being constructed from a single type of transistor.

25. A full swing logic circuit comprising:
a logic unit comprising a first PMOS transistor and an output node, the logic unit being coupled to a high voltage reference $V_{DD}$;
a second PMOS transistor comprising a gate, a source, and a drain, the drain being coupled to the output node of the logic unit, the source being coupled to a low voltage reference $V_{SS}$; and
a voltage level adjuster coupled to the gate of the second PMOS transistor, the voltage level adjuster being configured to generate a high or low level gate signal when the output node of the logic unit has a high or low level, respectively, the low level gate signal having a voltage level lower than that of $V_{SS}$.

26. A full swing logic circuit comprising:
a logic unit comprising a first NMOS transistor and an output node, the logic unit being coupled to a low voltage reference $V_{SS}$;
a second NMOS transistor comprising a gate, a source, and a drain, the source being coupled to the output node of the logic unit, the drain being coupled to a high voltage reference $V_{DD}$; and
a voltage level adjuster coupled to the gate of the second NMOS transistor, the voltage level adjuster being configured to generate a high or low level gate signal when the output node of the logic unit has a high or low level, respectively, the high level gate signal having a voltage level higher than that of $V_{DD}$.

27. A method comprising:
switching an output node to a first logic state;
driving the output node to a first voltage level substantially equal to that of a first voltage reference;
turning off a driving unit comprising a PMOS transistor when the output node is driven to a high voltage level, or turning off a driving unit comprising an NMOS transistor when the output node is driven to a low voltage level;
switching the output node to a second logic state, driving the output node to a second voltage level substantially equal to that of a second voltage reference by using the driving unit; and
controlling the driving unit using a control signal having a voltage level outside of a range between the first voltage reference and the second voltage reference.

28. The method of claim 27 wherein the driving unit comprises a PMOS transistor, and controlling the driving unit comprises using a control signal having a voltage level lower than that of the second voltage reference when the output node is switched to the second logic state.

29. The method of claim 27 wherein the driving unit comprises an NMOS transistor, and controlling the driving unit comprises using a control signal having a voltage level higher than that of the second voltage reference when the output node is switched to the second logic state.

30. The method of claim 27 wherein determining the logic state comprises using a logic circuit to determine the logic state, the logic circuit and the driving unit being constructed using a single type of transistor.

31. A method comprising:
generating a logic signal to drive a module of a display, in which generating the logic signal comprises
determining, using a logic circuit, a logic state of an output node;
driving the output node to a voltage level substantially equal to that of a first voltage reference and turning off a driving unit when the output node is at a first logic state; and
driving the output node to a voltage level substantially equal to that of a second voltage reference by using the driving unit, and controlling the driving unit using a control signal having a voltage level outside of a range between the first voltage reference and the second voltage reference.

32. The method of claim 31 wherein the logic circuit, the driving unit, and pixel circuits of the display comprise a single type of transistor.

33. The full swing logic circuit of claim 25 in which the voltage level adjuster is configured to generate a high or low level gate signal when the output of the voltage level adjuster is not connected to the second PMOS transistor.

34. The full swing logic circuit of claim 25 in which the voltage level adjuster includes at least two PMOS transistors.

35. The full swing logic circuit of claim 25 in which the current flowing though the second PMOS transistor is reduced when the voltage level adjuster generates a high level gate signal.

36. The full swing logic circuit of claim 26 in which the voltage level adjuster is configured to generate a high or low level gate signal when the output of the voltage level adjuster is not connected to the second NMOS transistor.

37. The full swing logic circuit of claim 26 in which the voltage level adjuster includes at least two NMOS transistors.

38. The full swing logic circuit of claim 26 in which the current flowing through the second NMOS transistor is reduced when the voltage level adjuster generates a high level gate signal.

* * * * *

UNITED STATES PATENT AND TRADEMARK OFFICE
CERTIFICATE OF CORRECTION

| | | |
|---|---|---|
| PATENT NO. | : 7,514,961 B2 | Page 1 of 1 |
| APPLICATION NO. | : 11/675909 | |
| DATED | : April 7, 2009 | |
| INVENTOR(S) | : Ming-Chun Tseng | |

It is certified that error appears in the above-identified patent and that said Letters Patent is hereby corrected as shown below:

In claim 35, column 15, line 8, delete "though" and insert -- through --

Signed and Sealed this

Fourteenth Day of July, 2009

JOHN DOLL
*Acting Director of the United States Patent and Trademark Office*